(12) United States Patent
Park et al.

(10) Patent No.: US 10,910,063 B2
(45) Date of Patent: Feb. 2, 2021

(54) MEMORY DEVICE AND OPERATING METHOD THEREOF

(71) Applicant: SK hynix Inc., Gyeonggi-do (KR)

(72) Inventors: Cho Rong Park, Chungcheongbuk-do (KR); Cheol Joong Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/732,949

(22) Filed: Jan. 2, 2020

(65) Prior Publication Data

US 2020/0381057 A1    Dec. 3, 2020

(30) Foreign Application Priority Data

Jun. 3, 2019    (KR) ........................ 10-2019-0065607

(51) Int. Cl.
*G11C 16/14*    (2006.01)
*G11C 16/04*    (2006.01)
*G11C 16/34*    (2006.01)
*G06F 3/06*    (2006.01)

(52) U.S. Cl.
CPC ............ *G11C 16/14* (2013.01); *G06F 3/0604* (2013.01); *G06F 3/0652* (2013.01); *G06F 3/0659* (2013.01); *G06F 3/0679* (2013.01); *G11C 16/0483* (2013.01); *G11C 16/3445* (2013.01)

(58) Field of Classification Search
CPC .... G11C 13/0097; G11C 16/225; G11C 16/14
See application file for complete search history.

(56) References Cited

U.S. PATENT DOCUMENTS

2017/0168752 A1* 6/2017 Micheloni ............ G06F 3/0604
2018/0247695 A1   8/2018 Kasai et al.
2020/0303012 A1* 9/2020 Nishikawa ............ G11C 16/16

FOREIGN PATENT DOCUMENTS

KR    10-2010-0000776    1/2010

* cited by examiner

Primary Examiner — Han Yang
(74) Attorney, Agent, or Firm — IP & T Group LLP

(57) ABSTRACT

A memory device having an improved threshold voltage distribution includes: a memory block including a plurality of memory cells; a peripheral circuit configured to perform an erase operation on the memory block; and control logic configured to: control the peripheral circuit to suspend the erase operation in response to a suspend command received from an external source, determine an erase state of the plurality of memory cells by using a plurality of erase state verify voltages in response to a resume command received subsequently to the suspend command, and determine a level of an erase voltage to be applied to the memory block and an erase voltage applying time for which the erase voltage is to be applied based on the determination result.

21 Claims, 20 Drawing Sheets

FIG. 12

ERASE VOLTAGE OFFSET STORAGE

| NUMBER OF TIMES Vvfy IS APPLIED | Voff | Toff |
|---|---|---|
| 1 | Voff_1 | Toff_1 |
| 2 | Voff_2 | Toff_2 |
| 3 | Voff_3 | Toff_3 |
| ⋮ | ⋮ | ⋮ |
| k | Voff_k | Toff_k |

FIG. 16

ERASE STATE VERIFY VOLTAGE OFFSET STORAGE

| te − ts | ERASE STATE VERIFY START VOLTAGE | MAXIMUM NUMBER OF TIMES ERASE STATE IS VERIFIED | ERASE STATE VERIFY STEP VOLTAGE |
|---|---|---|---|
| $T\_1$ | $X\_1$ | $Y\_1$ | $Z\_1$ |
| $T\_2$ | $X\_2$ | $Y\_2$ | $Z\_2$ |
| $T\_3$ | $X\_3$ | $Y\_3$ | $Z\_3$ |
| ⋮ | ⋮ | ⋮ | ⋮ |
| $T\_k$ | $X\_k$ | $Y\_k$ | $Z\_k$ |

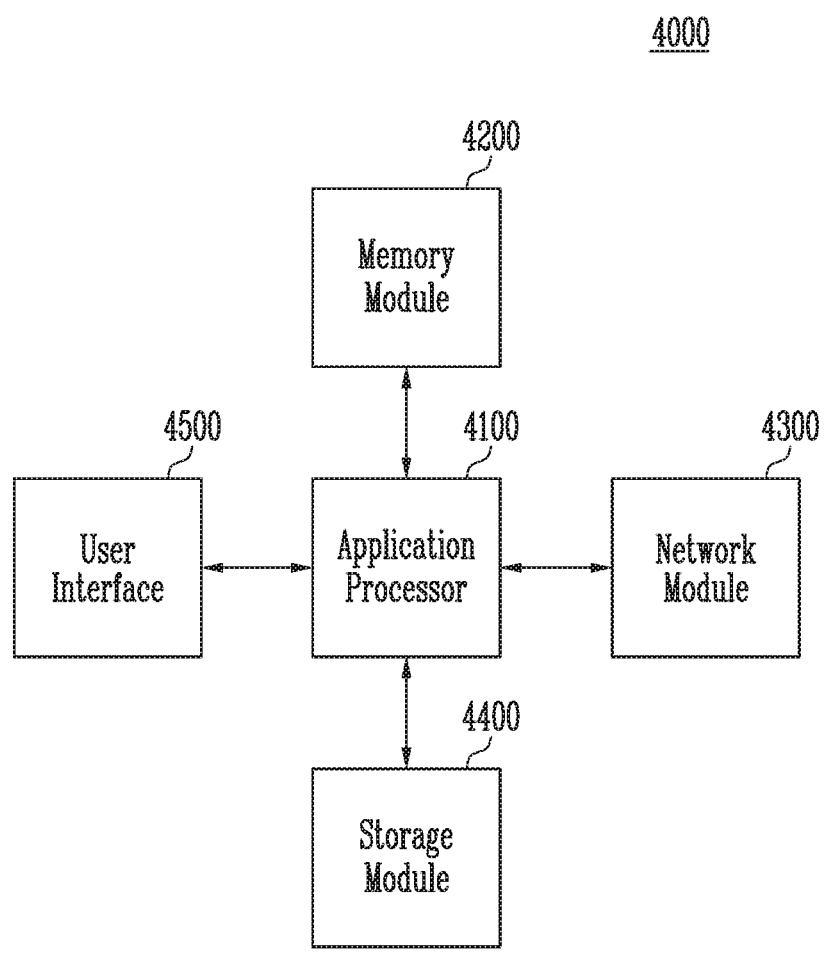

MEMORY DEVICE AND OPERATING METHOD THEREOF

CROSS-REFERENCE TO RELATED APPLICATION

The present application claims priority under 35 U.S.C. § 119(a) to Korean patent application number 10-2019-0065607, filed on Jun. 3, 2019, which is incorporated herein by reference in its entirety.

BACKGROUND

1. Field of Invention

The present disclosure generally relates to an electronic device, and more particularly, to a memory device and an operating method thereof.

2. Description of Related Art

A memory device is implemented using a semiconductor such as silicon (Si), germanium (Ge), gallium arsenide (GaAs), or indium phosphide (InP). Generally, there are two types of memory devices: a volatile memory device and a nonvolatile memory device.

In a volatile memory device stored data disappears when the supply of power is interrupted. Examples of a volatile memory device include a static random access memory (SRAM), a dynamic RAM (DRAM), a synchronous DRAM (SDRAM), and the like. In a nonvolatile memory device stored data is retained even when the supply of power is interrupted. Examples of a nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Generally, a flash memory is a NOR type flash memory or a NAND type flash memory.

SUMMARY

Embodiments provide a memory device having an improved threshold voltage distribution and an operating method of the memory device.

In accordance with an aspect of the present disclosure, there is provided a memory device including: a memory block including a plurality of memory cells; a peripheral circuit configured to perform an erase operation on the memory block; and control logic configured to: control the peripheral circuit to suspend the erase operation in response to a suspend command received from an external source, determine an erase state of the plurality of memory cells by using a plurality of erase state verify voltages in response to a resume command received subsequently to the suspend command, and determine a level of an erase voltage to be applied to the memory block and an erase voltage applying time for which the erase voltage is to be applied based on the determination result.

In accordance with another aspect of the present disclosure, there is provided a method for operating a memory device for performing an erase operation on a memory block including a plurality of memory cells, the method including: performing the erase operation in response to an erase command received from a memory controller; suspending the erase operation in response to a suspend command received from the memory controller; determining a threshold voltage state of the plurality of memory cells by applying a plurality of erase state verify voltages to the plurality of memory cells, when a resume command is received from the memory controller; and determining an erase voltage to be applied to the memory block, based on a result of the determining operation.

In accordance with an aspect of the present disclosure, there is provided a storage device including: a memory device including a plurality of memory cells; a controller suitable for sequentially providing the memory device with an erase command, a suspend command and a resume command, wherein the memory device: performs an erase operation on the plurality of memory cells using a first erase voltage corresponding to a first erase pulse in response to the erase command; suspends the erase operation in response to the suspend command; verifies an erase state of the plurality of memory cells using a plurality of erase state verify voltages including a first erase state verify voltage and a second erase state verify voltage, greater than the first erase state verify voltage by a step voltage, in response to the resume command; determines a level and a duration of a second erase pulse based on a result of the verify operation; and re-performs the erase operation on the plurality of memory cells using a second erase voltage corresponding to the second erase pulse.

BRIEF DESCRIPTION OF THE DRAWINGS

Various embodiments are described more fully below with reference to the accompanying drawings; however, features and aspects of the present invention may be embodied in different forms and thus should not be construed as limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. Like reference numerals refer to like elements throughout. Also, throughout the specification, reference to "an embodiment," "another embodiment" or the like is not necessarily to only one embodiment, and different references to any such phrase are not necessarily to the same embodiment(s).

FIG. 12 is a diagram illustrating an erase voltage offset storage in accordance with an embodiment of the present disclosure.

FIG. 16 is a diagram illustrating an erase state verify voltage offset storage, such as that shown in FIG. 14.

FIG. 21 is a block diagram illustrating a user system to which the storage device is applied in accordance with an embodiment of the present disclosure.

DETAILED DESCRIPTION

Figure 1:
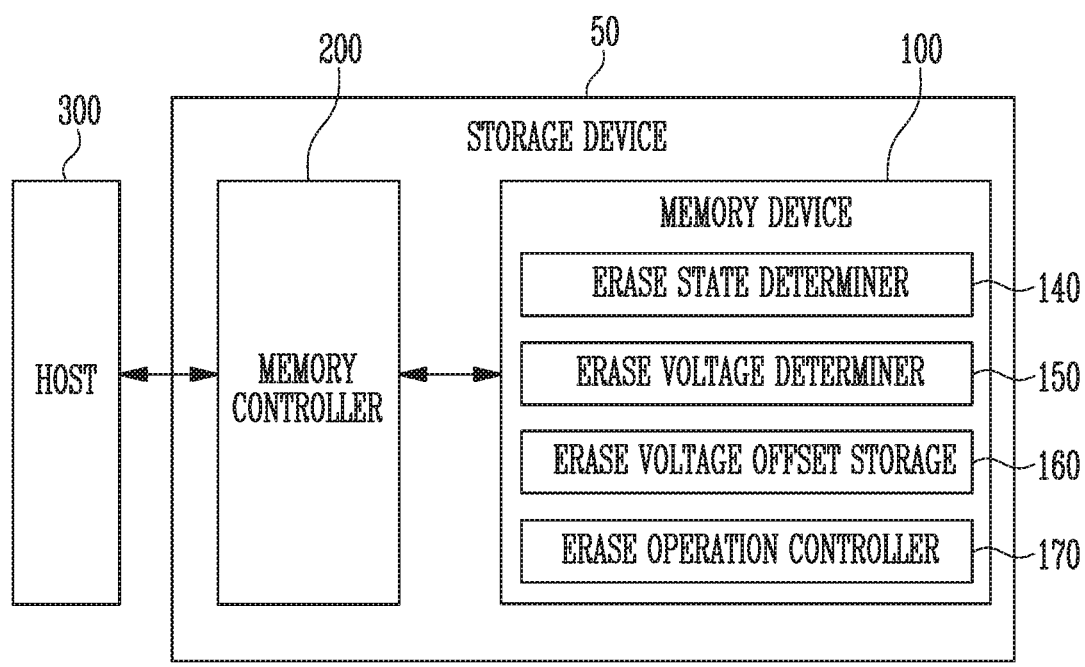
FIG. 1 is a block diagram illustrating a storage device in accordance with an embodiment of the present disclosure.

The specific structural and functional description provided herein is for the purpose of describing embodiments of the present invention. The present invention, however, can be implemented in various forms and ways, and thus is not limited to the embodiments set forth herein.

Moreover, while the disclosed embodiments are described in detail, the present invention is not limited to any specific detail. Rather, the present invention includes all changes, equivalents, or substitutes that do not depart from the spirit and technical scope of the present invention.

While terms such as "first" and "second" may be used to identify various components, such components are limited by the above terms. The above terms are used only to distinguish one component from another. A first component in one instance may be referred to as a second component in another instance without implying or suggesting any substantive change to the structure or function of the component itself.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Moreover, when an element is indicated as being "between" two elements, that element is not necessarily the only element there between, unless indicated to be "directly" or "immediately" between the two elements. Meanwhile, other expressions describing relationships between components such as "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. Ordinary dictionary-defined terms should be understood such that they have meanings consistent with the context of the related technique. So far as not being clearly defined in this application, terms should not be understood in an ideally or excessively formal way.

In for the following description, techniques that are well known to the art to which the present disclosure pertains and not directly related to the present disclosure may be omitted to more clearly focus on features and aspects of the present invention.

Various embodiments of the present disclosure are described in detail below with reference to the accompanying drawings to enable those skilled in the art to practice the present invention.

FIG. 1 is a block diagram illustrating a storage device 50 in accordance with an embodiment of the present disclosure.

Referring to FIG. 1, the storage device 50 may include a memory device 100 and a memory controller 200. The storage device 50 may store data under the control of a host 300, such as a mobile phone, a smart phone, an MP3 player, a laptop computer, a desktop computer, a game console, a television (TV), a tablet personal computer (PC) or an in-vehicle infotainment.

The storage device 50 may be configured as any of various types of data storage devices according to a host interface that is a communication scheme with the host 300. For example, the storage device 50 may be implemented by a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and/or a memory stick.

The storage device 50 may be manufactured as any of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and/or a Wafer-level Stack Package (WSP).

The memory device 100 may store data. The memory device 100 may operate under the control of the memory controller 200. The memory device 100 may include a memory cell array including a plurality of memory cells for storing data.

Each memory cell may operate as a Single Level Cell (SLC) storing one bit of data, a Multi-Level Cell (MLC)

storing two bits of data, a Triple Level Cell (TLC) storing three bits of data, or a Quadruple Level Cell (QLC) storing four bits of data.

The memory cell array may include a plurality of memory blocks. Each memory block may include a plurality of memory cells. The memory block may be a unit for erasing data stored in the memory device 100. In an embodiment, the memory block may include a plurality of pages. Each page may be a unit for storing data in the memory device 100 or reading data stored in the memory device 100.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. By way of example, features and aspects of the present invention are described in the context in which the memory device 100 is a NAND flash memory.

The memory device 100 may receive a command and an address from the memory controller 200, and access an area selected by the address in the memory cell array. That is, the memory device 100 may perform an operation corresponding to the received command with respect to the area selected by the address. For example, the memory device 100 may perform a program operation, a read operation, and an erase operation. The program operation may include storing data in memory cells in the memory device 100. The memory device 100 may perform a program operation of storing data in the area selected by the address according to a program command input from the memory controller 200. The read operation may include sensing data stored in memory cells by using a read voltage. The memory device 100 may sense data stored in the area selected by the address according to a read command from the memory controller 200. The erase operation may include erasing data stored in memory cells. The memory device 100 may erase data stored in the area selected by the address according to an erase command from the memory controller 200. In an embodiment, erasing data stored in memory cells may mean that threshold voltages of the memory cells are decreased to belong to a threshold voltage distribution corresponding to an erase state.

In the erase operation the time required until the operation is completed may be relatively long. While the erase operation is being performed, the memory device may not perform any other operation. For example, while the erase operation is being performed, a need to perform a read operation on data stored in the memory device 100 may occur. Therefore, the memory controller 200 may provide a suspend command to the memory device 100. The memory device 100 may suspend the erase operation being performed in response to the suspend command. The memory controller 200 may perform a higher-priority read operation, and provide a resume command to the memory device 100 to resume the erase operation after the read operation is completed.

In accordance with an embodiment, the memory device 100 may include an erase state determiner 140, an erase voltage determiner 150, an erase voltage offset storage 160, and an erase operation controller 170.

The erase state determiner 140 may control the memory device 100 to determine whether threshold voltages of a plurality memory cells in a memory block correspond to that of the erase state, in response to the resume command provided by the memory controller 200. Specifically, the erase state determiner 140 may control the memory device 100 to apply an erase state verify voltage while increasing the erase state verify voltage by a set step voltage. The erase state determiner 140 may generate erase state determination information according to the erase state verify voltage. The erase state determination information may include information on the number of times the erase state verify voltage is applied until the number of on-cells sensed according to the erase state verify voltage is less than or equal to a reference number. Alternatively, the erase state determination information may include information on the number of times the erase state verify voltage is applied until the number of off-cells is greater than or equal to the reference number.

The erase voltage determiner 150 may generate erase voltage information on an erase voltage to be applied in a read operation resumed in response to the resume command. In an embodiment, the erase voltage determiner 150 may generate the erase voltage information, based on the erase state determination information provided from the erase state determiner 140. Specifically, the erase voltage information may include information on an erase voltage magnitude offset Voff and an erase voltage apply time offset Toff, based on an erase voltage lastly applied before the suspend command is input. The erase voltage magnitude offset Voff may correspond to a change in magnitude (or level) of the erase voltage. The erase voltage apply time offset Toff may correspond to a change in time for which the erase voltage is applied. Each of the erase voltage magnitude offset Voff and the erase voltage apply time offset Toff may have a positive or negative value.

In an embodiment, the erase voltage determiner 150 may generate erase voltage information by using erase voltage offset information stored in the erase voltage offset storage 160. The erase voltage offset information may be information on an offset according to the number of times the erase state verify voltage is applied. The information on the offset may include the erase voltage magnitude offset Voff and/or the erase voltage apply time offset Toff. The erase voltage determiner 150 may determine information on the erase voltage magnitude offset Voff and the erase voltage apply time offset Toff of an erase voltage to be used in a resumed erase operation. In an embodiment, the erase voltage determiner 150 may determine the information on the erase voltage magnitude offset Voff and the erase voltage apply time offset Toff based on the erase state determination information and the erase voltage offset information. The erase state determination information may be generated by the erase state determiner 140 (particularly, the number of times the erase state verify voltage is applied). The erase voltage offset information may be stored in the erase voltage offset storage 160.

The erase operation controller 170 may control the memory device 100 to perform an erase operation in response to the erase command and the resume command, which are input from the memory controller 200. In an embodiment, when the resume command is input, the erase operation controller 170 may control the memory device 100 to apply an erase voltage corresponding to the erase voltage information determined by the erase voltage determiner 150.

The memory controller 200 may control overall operations of the storage device 50.

When a power voltage is applied to the storage device 50, the memory controller 200 may execute firmware (FW) stored therein. When the memory device 100 is a flash memory device, the memory controller 200 may execute FW such as an FTL for controlling communication between the host 300 and the memory device 100.

When a write request is input from the host 300, the memory controller 200 may receive data to be stored and a logical address (LA) for distinguishing the corresponding data, which are input from the host 300. The memory controller 200 may translate the input LA into a physical address (PA) representing an address of memory cells in which data is to be stored among the memory cells in the memory device 100. The memory controller 200 may provide the memory device 100 with a program command for storing data, the translated PA, and the data to be stored.

In an embodiment, when an erase request is input from the host 300, the memory controller 200 may receive an LA for distinguishing data to be erased, which is input from the host 300. The memory controller 200 may acquire a PA corresponding to the input LA, and provide the memory device 100 with an erase command and the PA. In various embodiments, in an erase operation, the memory controller 200 may provide the memory device 100 with the erase command and the PA.

In an embodiment, the memory controller 200 may control the memory device 100 to autonomously perform a program operation, a read operation, or an erase operation, regardless of any request from the host 300. For example, the memory controller 200 may control the memory device 100 to perform background operations such as wear leveling, garbage collection, and read reclaim.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

Figure 2:
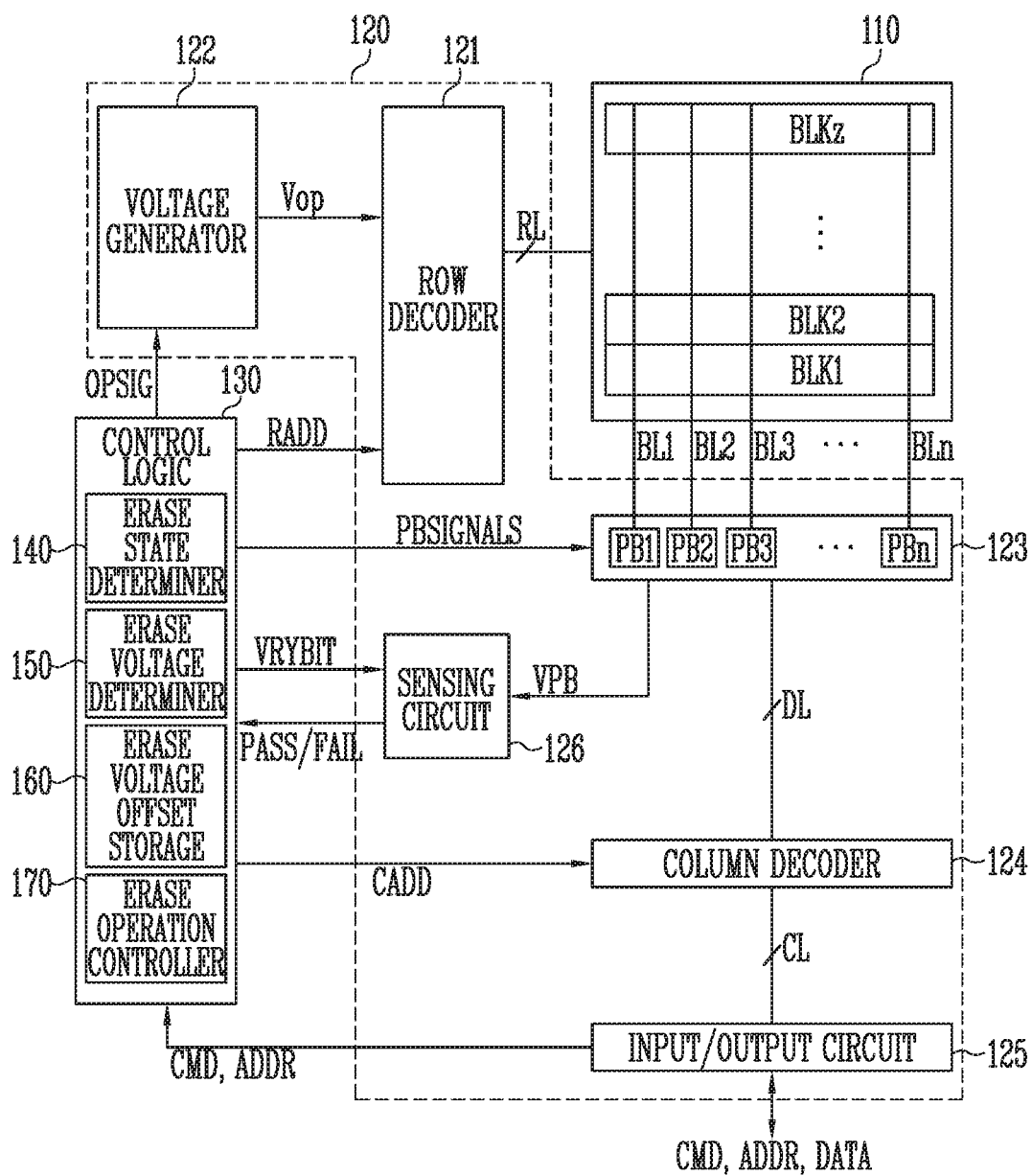
FIG. 2 is a diagram illustrating a structure of a memory device, such as that shown in FIG. 1.

FIG. 2 is a diagram illustrating a structure of a memory device 100 shown in FIG. 1.

Referring to FIG. 2, the memory device 100 may include a memory cell array 100, a peripheral circuit 120, and control logic 130.

The peripheral circuit 120 may include a row decoder 121, a voltage generator 122, a page buffer group 123, a column decoder 124, and an input and output (input/output) circuit 125.

The memory cell array 110 includes a plurality of memory blocks BLK1 to BLKz. The plurality of memory blocks BLK1 to BLKz are coupled to the row decoder 121 through row lines RL. The plurality of memory blocks BLK1 to BLKz are coupled to the page buffer group 123 through bit is lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells in the memory cell array 110 may be configured as a Single Level Cell (SLC) storing one bit of data, a Multi-Level Cell (MLC) storing two bits of data, a Triple Level Cell (TLC) storing three bits of data, or a Quadruple Level Cell (QLC) storing four bits of data.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic 130. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

In a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a unit of a memory block. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, and an erased voltage under the control of the control logic 130.

In an embodiment, the voltage generator 122 may generate an internal power voltage by regulating the external power voltage. The internal power voltage is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of voltages may be supplied to the memory cell array 110 by the row decoder 121.

The page buffer group 123 includes first to nth page buffers PB1 to PBn, which are coupled to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program pulse is applied to a selected word line. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) is applied may be maintained. In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example, the column decoder 124 may communicate data with the first to nth page buffers PB1 to PBn through data lines EL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or verify operation, the sensing circuit 126 may generate a reference current in response to an allow bit VRYBIT signal. Further, the sensing circuit 126 may output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS/FAIL In accordance with an embodiment of the present disclosure, the control logic 130 may include an erase state determiner 140, an erase voltage determiner 150, an erase voltage offset storage 160, and an erase operation controller 170.

When a resume command is input, the erase state determiner 140 may control the memory device 100 to perform an erase state determination operation. The erase state determination operation may include an operation of controlling the peripheral circuit 120 to apply an erase state verify voltage to the memory cell array 110 and providing the erase voltage determiner 150 with erase state determination information acquired from the memory cell array 110. The erase state determination information may include information on the number of times the erase state verify voltage is applied.

The erase voltage determiner 150 may output erase voltage information as information on an erase voltage to be applied when a suspended erase operation is resumed by receiving the erase state determination information from the erase state determiner 140. The erase voltage information may include information on an erase voltage magnitude offset Voff and an erase voltage apply time offset Toff. The erase voltage magnitude offset Voff may be a magnitude differential of an erase voltage representing change from an erase voltage lastly applied before the erase operation is suspended. The erase voltage apply time offset Toff may represent a time for which the changed erase voltage is applied. Each of the erase voltage magnitude offset Voff and the erase voltage apply time offset Toff may have a positive or negative value.

The erase voltage offset storage 160 may store erase state offset information as information on an erase voltage magnitude offset Voff and an erase voltage apply time offset Toff according to the number of times the erase state verify voltage is applied.

In an embodiment, when the resume command is input, the erase state determiner 140 may control the memory device 100 to apply a plurality of erase state verify voltages while increasing the plurality of erase state verify voltages by a set step voltage. Further, the erase state determiner 140 may provide the erase voltage determiner 150 with the number of times the erase state verify voltages are applied. Subsequently, the erase voltage determiner 150 may output information on an erase voltage magnitude offset Voff and an erase voltage apply time offset Toff to the erase operation controller 170. The erase voltage magnitude offset Voff and the erase voltage apply time offset Toff correspond to the number of times the erase state verify voltages are applied, according to the erase voltage offset information stored in the erase voltage offset storage 160.

The erase operation controller 170 may receive the erase voltage information from the erase voltage determiner 150, to control the memory device 100 to perform the erase operation according to a corresponding erase voltage.

Figure 3:
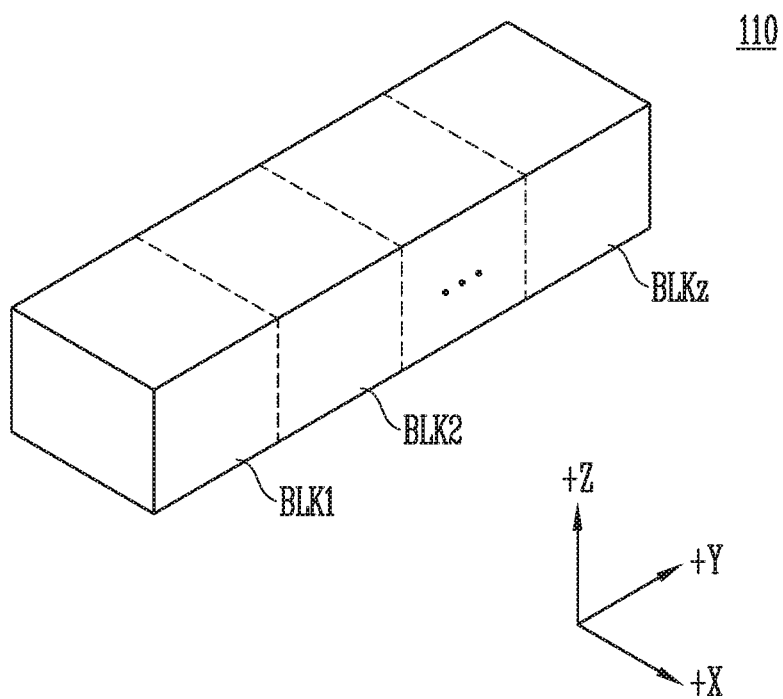
FIG. 3 is a diagram illustrating a memory cell array, such as that shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block is described in more detail with reference to FIGS. 4 and 5.

Figure 4:
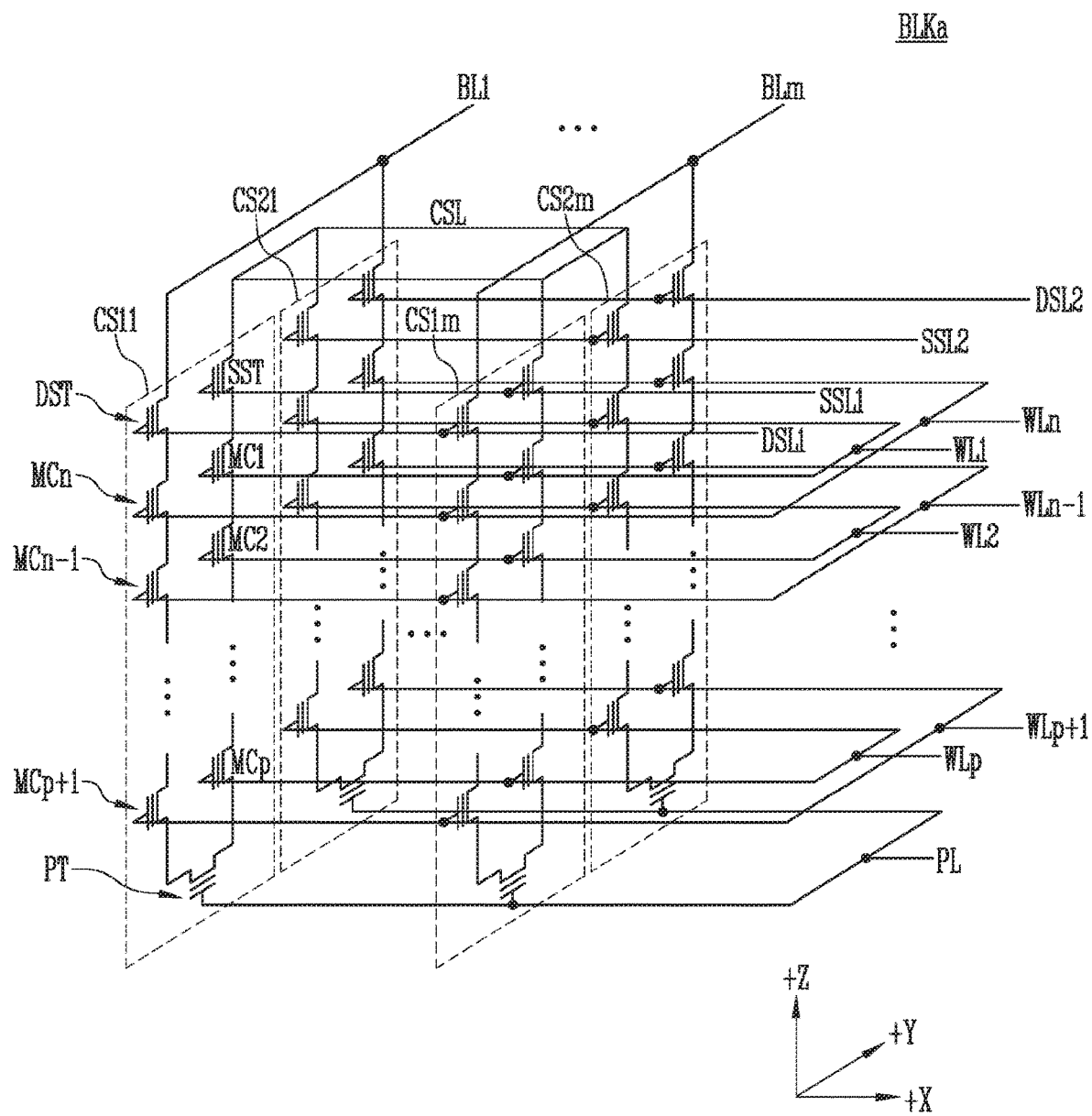
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for clarity; three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. Even-numbered cell strings among the cell strings CS11 to CS1m or CS21 to CS2m arranged in the row direction may be coupled to the even bit lines, respectively. Odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells may control a voltage applied to the dummy word lines coupled to the respective dummy memory cells, so that the dummy memory cells can have the required threshold voltage.

Figure 5:
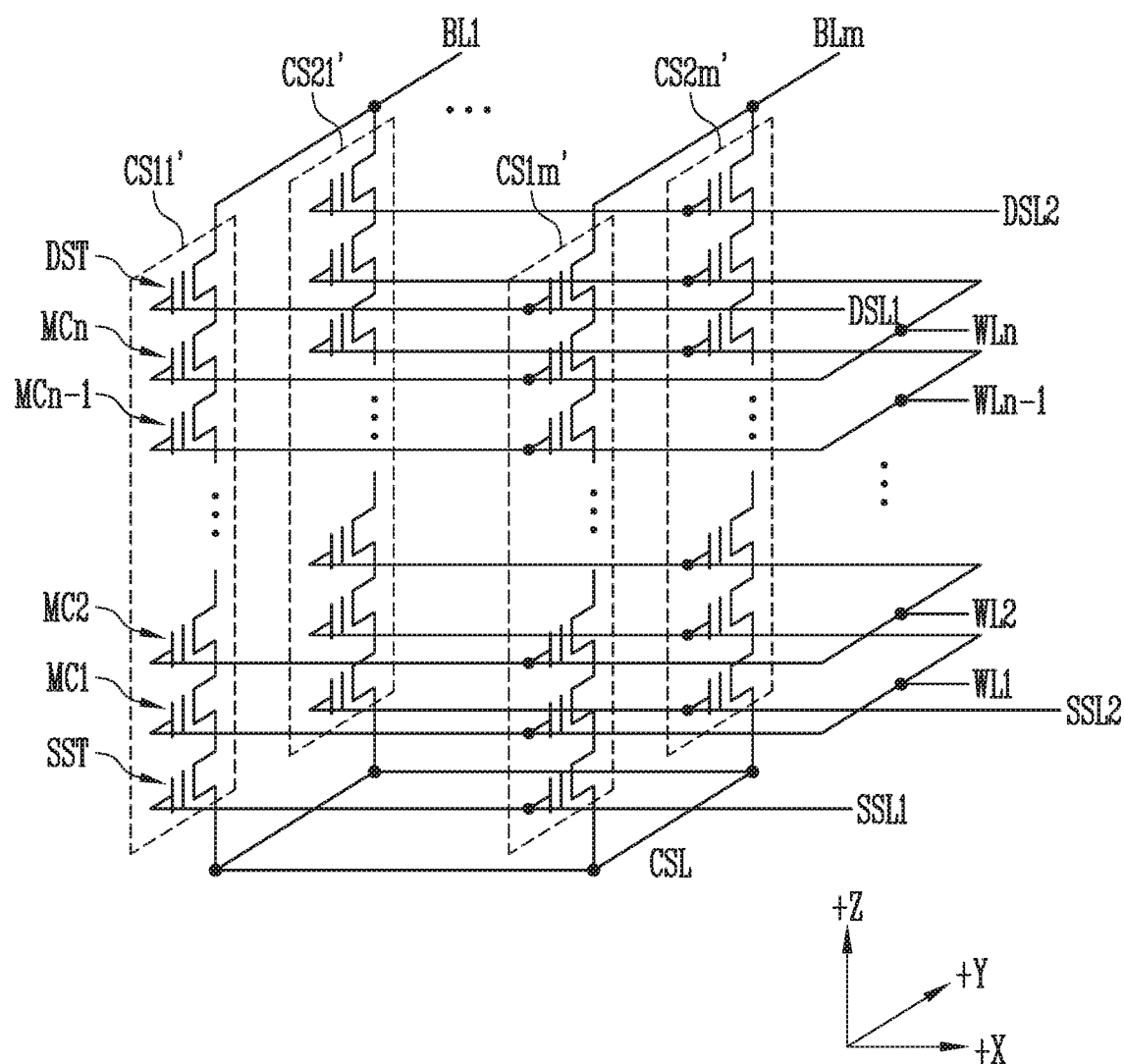
FIG. 5 is a circuit diagram illustrating another embodiment of a representative memory block among the memory blocks shown in FIG. 3.

FIG. 5 is a circuit diagram illustrating another embodiment of a representative memory block BLKb among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. Even-numbered cell strings among the cell strings CS11' to CS1m' or CS21' to CS2m' arranged in the row direction may be coupled to the even bit lines, respectively. Odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells may control a voltage applied to the dummy word lines coupled to the respective dummy memory cells, so that the dummy memory cells can have the required threshold voltage.

Figure 6:
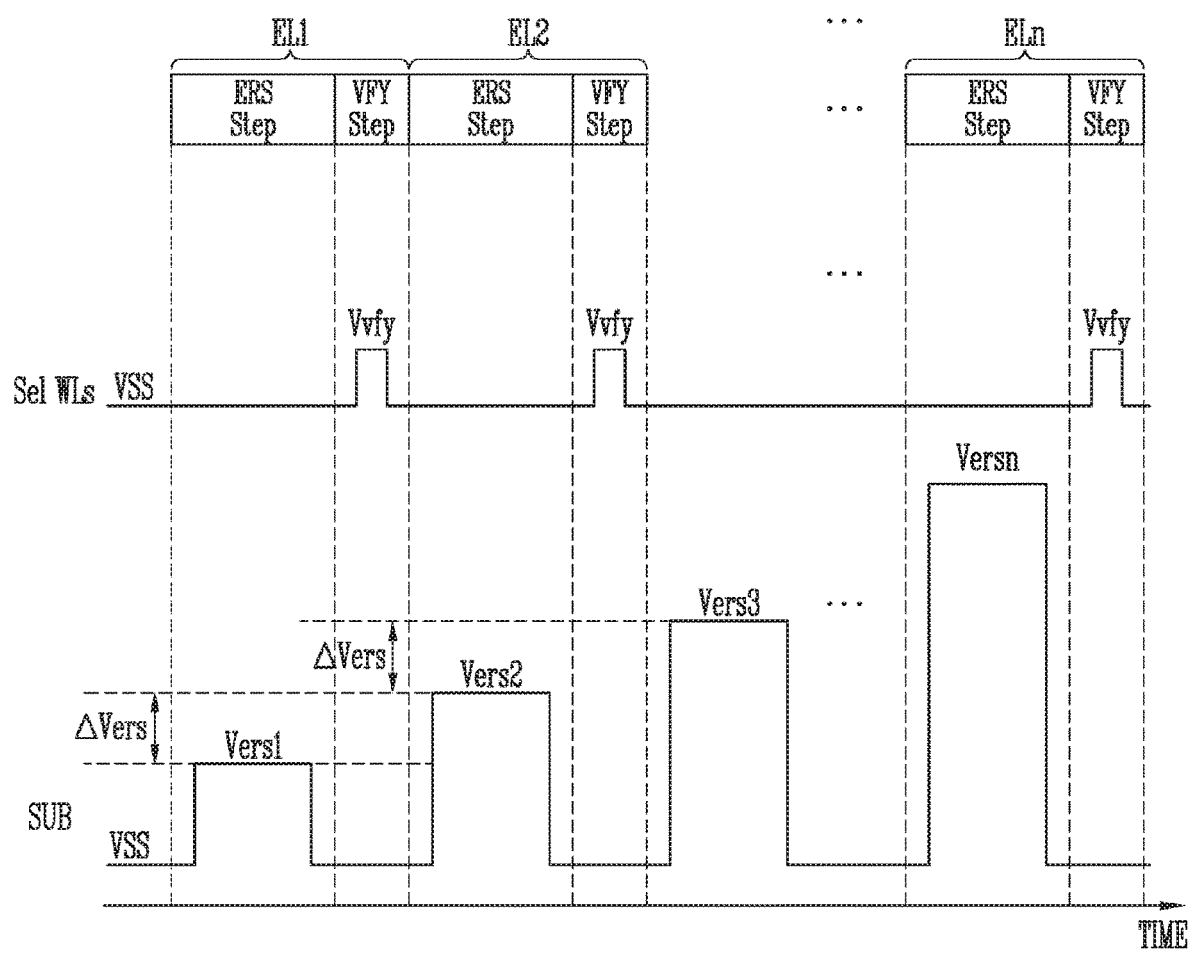
FIG. 6 is a diagram illustrating an erase operation of a memory block.

FIG. 6 is a diagram illustrating an erase operation of a memory block.

Referring to FIG. 6, the erase operation may include first to nth erase loops EL1 to ELn (where n is a positive integer of 1 or more). Each erase loop EL may include an erase step ERS Step and a verify step VFY step.

In the erase step ERS Step, an erase voltage Vers may be applied to a channel region of a plurality of memory cell strings in a memory block. That is, the erase voltage Vers may be applied to a substrate SUB including the channel region. A ground voltage VSS may be applied to word lines coupled to the memory block while the erase voltage Vers is being applied.

In the verify step VFY Step, the memory device may determine whether memory cells in the memory block have threshold voltages corresponding to an erase state. Specifically, in the verify step VFY Step, an erase verify voltage Vvfy may be applied to the word lines coupled to the memory block. The memory cells may be determined as on-cells or off-cells according to whether the threshold voltages of the memory cells are less than the erase verify voltage Vvfy.

When the threshold voltages of the memory cells are less than the erase verify voltage Vvfy, the memory cells may be determined as on-cells. When the threshold voltages of the memory cells are greater than or equal to the erase verify voltage Vvfy, the memory cells may be determined as off-cells. In the verify step VFY Step, when the number of memory cells having threshold voltages less than the erase verify voltage Vvfy (on-cells) exceeds a set number, the erase operation may pass. Alternatively, when a number of memory cells having threshold voltages higher than the erase verify voltage Vvfy is less than or equal to the set number, the erase operation may pass. The erase loop EL may be repeated until the erase operation passes.

Whenever the erase loop EL is repeated, the level of the erase voltage Vers may be increased by a step voltage ΔVers. More specifically, the level of the erase voltage Vers may be increased by an incremental step pulse erase (ISPE) scheme. The level of an erase voltage Vers2 of the second erase loop EL2 may be Vers1 of EL1 increased by the step voltage ΔVers. The level of an erase voltage Vers3 of the third erase loop EL3 may be Vers2 increased by the step voltage ΔVers. In this manner, the level of an erase voltage Versn of the nth erase loop ELn may be Vers(n−1) of the (n−1)th erase loop EL(n−1) increased by the step voltage ΔVers. That is, each erase voltage after the first may be the previous erase voltage plus the step voltage.

Figure 7:
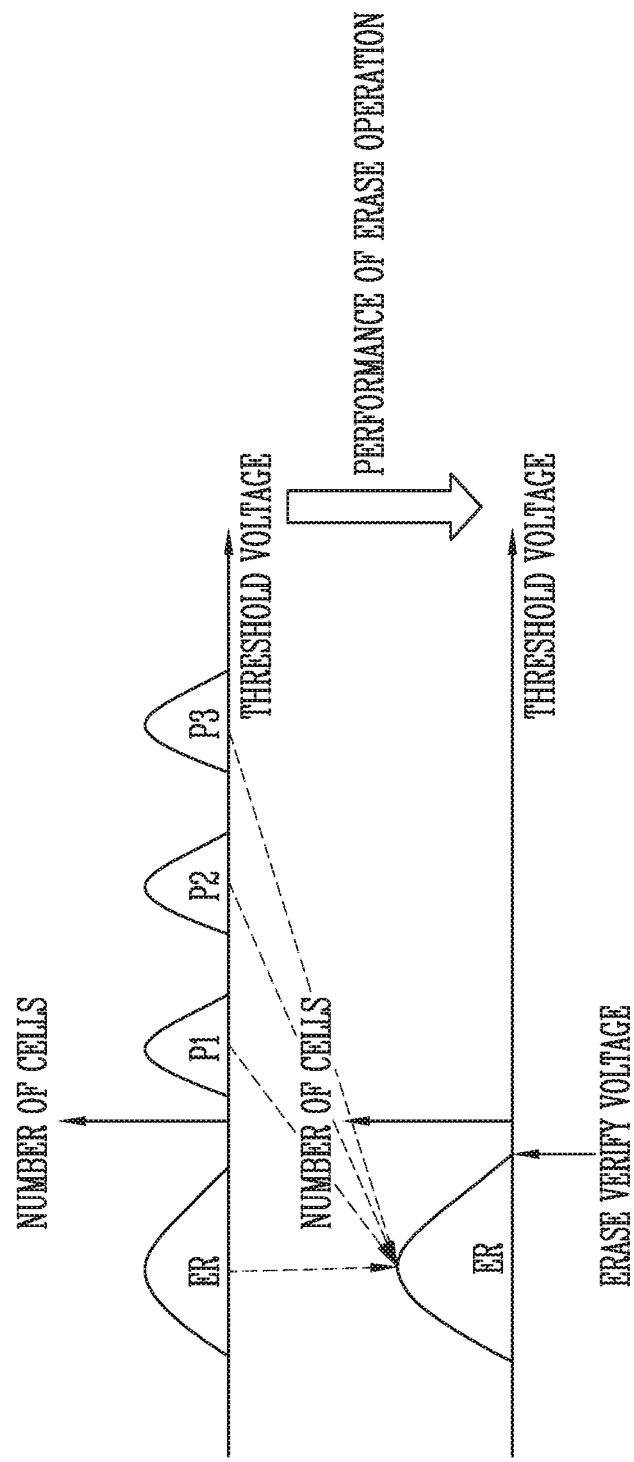
FIG. 7 is a diagram illustrating a threshold voltage distribution according to the erase operation.

FIG. 7 is a diagram illustrating a threshold voltage distribution according to the erase operation.

Referring to FIG. 7, the horizontal axis represents a threshold voltage, and the vertical axis represents the number of memory cells.

In the following description, it is assumed that each of the memory cells is a multi-level cell storing two bits of data. However, embodiments of the present disclosure may be applied to other storage capacity memory cells.

Each of memory cells may have an erase state ER, a first program state P1, a second program state P2, or a third program state P3, according to the magnitude of a threshold voltage thereof. Each of the memory cells may be programmed to have the first program state P1, the second program state P2, or the third program state P3. When the erase operation is performed, the memory cells may have threshold voltages corresponding to the erase state ER.

Figure 8:
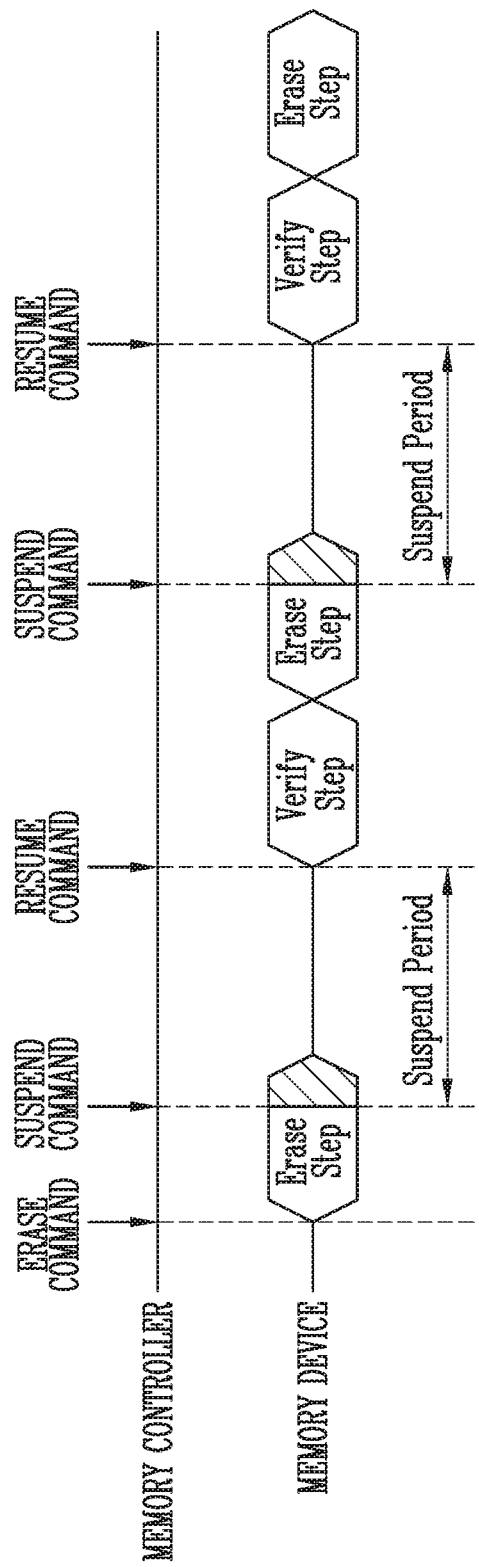
FIG. 8 is a diagram illustrating an operation of a memory device according to a suspend command and a resume command, which are provided by a memory controller while an erase operation on a memory block is being performed.

FIG. 8 is a diagram illustrating an operation of the memory device according to a suspend command and a resume command in accordance with an embodiment of the present disclosure.

Referring to FIG. 8, the memory controller may provide the memory device with an erase command for performing the erase operation described with reference to FIG. 6 on a memory block to be erased. The memory device may receive the erase command and perform an erase step (Erase Step) on the memory block to be erased.

The memory controller may suspend the erase operation being performed, when it is necessary to perform another operation while the memory device is performing the erase step. Specifically, the memory controller may provide a suspend command to the memory device. The memory device may receive the suspend command and suspend the erase operation being performed. In FIG. 8, the portion of the erase step indicated in FIG. 8 by hatching is not performed as a result of the suspend command.

The memory controller may suspend the erase operation being performed, when it is necessary to perform another operation while the memory device is performing the erase operation. That is, the memory controller may suspend the erase operation such that the memory device can perform other operations of higher priority than, or preferential to, the erase operation.

After the higher priority operations are performed, the suspended erase operation may be re-performed. Therefore, the memory controller may provide a resume command to the memory block to be erased, based on which the erase step (Erase Step) is performed.

Specifically, the memory controller may provide the resume command to the memory device after a suspend period (Suspend Period) elapses, which time may be indicated by the suspend command.

The suspend period represents the time during which the erase step on the memory block to be erased in the memory device is suspended. The suspend period may be a time from when the suspend command is input to a time at which the erase operation is resumed when the resume command is input. The memory device may perform an operation according to another command provided by the memory controller during the suspend period.

In accordance with an embodiment, when the resume command is input, an erase state determination step (Verify Step) may be performed. In an embodiment, the memory device may perform an erase step determination operation when the resume command is input. The erase state determination operation performed in the erase state determination step may be an operation of determining how many memory cells in the memory block to be erased have been erased. The erase state determination operation may include a plurality of erase state verify operations.

Specifically, the memory device may perform the erase state verify operations by using a plurality of erase state verify voltages obtained by increasing the magnitude of an erase state verify voltage by a predetermined verify step voltage. When threshold voltages of the memory cells in the memory block to be erased are lower than the erase state verify voltage, the memory cells may be determined as on-cells. When the threshold voltages of the memory cells are higher than or equal to the erase state verify voltage, the memory cells may be determined as off-cells. The memory device may determine a level of an erase voltage to be applied in a next loop and a time for which the erase voltage is applied, based on an erase state determination result.

Figure 9:
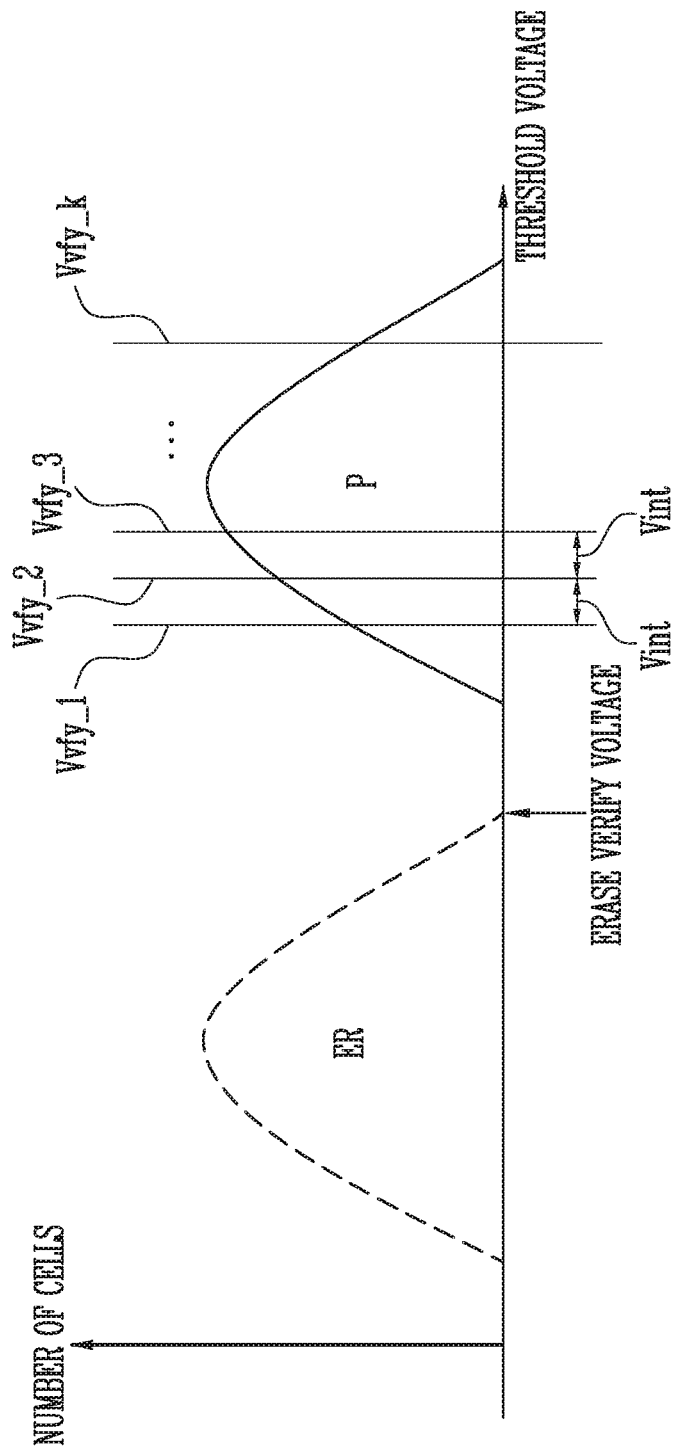
FIG. 9 is a diagram illustrating an erase state verify operation in accordance with an embodiment of the present disclosure.

FIG. 9 is a diagram illustrating an erase state verify operation in accordance with an embodiment of the present disclosure.

Referring to FIG. 9, the horizontal axis represents a threshold voltage, and the vertical axis represents the number of memory cells.

When an erase operation is performed, memory cells may have threshold voltages corresponding to the erase state ER, lower than an erase verify voltage, when an erase voltage is applied.

When a resume command is input from the memory controller, a plurality of erase state verify operations may be performed to accurately determine a threshold voltage distribution P of memory cells in a memory block to be erased.

The plurality of erase state verify operations may include determining threshold voltages of the memory cells in the memory block to be erased while increasing the magnitude of an erase state verify voltage by a set verify step voltage Vint. When a first erase state verify voltage $Vvfy\_1$ is applied, memory cells having threshold voltages lower than a first erase state verify voltage $Vvfy\_1$ may be determined as on-cells. Memory cells having threshold voltages greater than or equal to the first erase state verify voltage $Vvfy\_1$ may be determined as off-cells.

In an embodiment, the erase state verify operation may be performed until the number of on-cells sensed according to the erase state verify voltage exceeds a reference number, which may be predetermined. Alternatively, the erase state verify operation may be performed until the number of off-cells sensed according to the erase state verify voltage is less than the reference number. Thus, it can be seen that the threshold voltages of the memory cells increase, which corresponds to being further moved to the right on the graph shown in FIG. 9 as the number of times the erase state verify voltage is applied increases (as the number of times the erase state verify operation is performed increases).

Therefore, the memory device may determine a magnitude of the erase voltage such that its level is increased as the number of times k the erase state verify voltage is applied increases. In an embodiment, an increment in the magnitude of the erase voltage may correspond to a value obtained by subtracting the erase verify voltage from the magnitude of a last-applied erase state verify voltage Vvfy. In s6 an embodiment, the memory device may decrease the time for which the erase voltage is applied as the magnitude of the erase voltage increases, so that the width of the threshold voltage distribution can be narrowly formed. Alternatively, in an embodiment, the memory device may determine a time for which the erase voltage is applied such that the time at which the erase voltage is applied increases as the number of times k the erase state verify voltage is applied increases.

Figure 10:
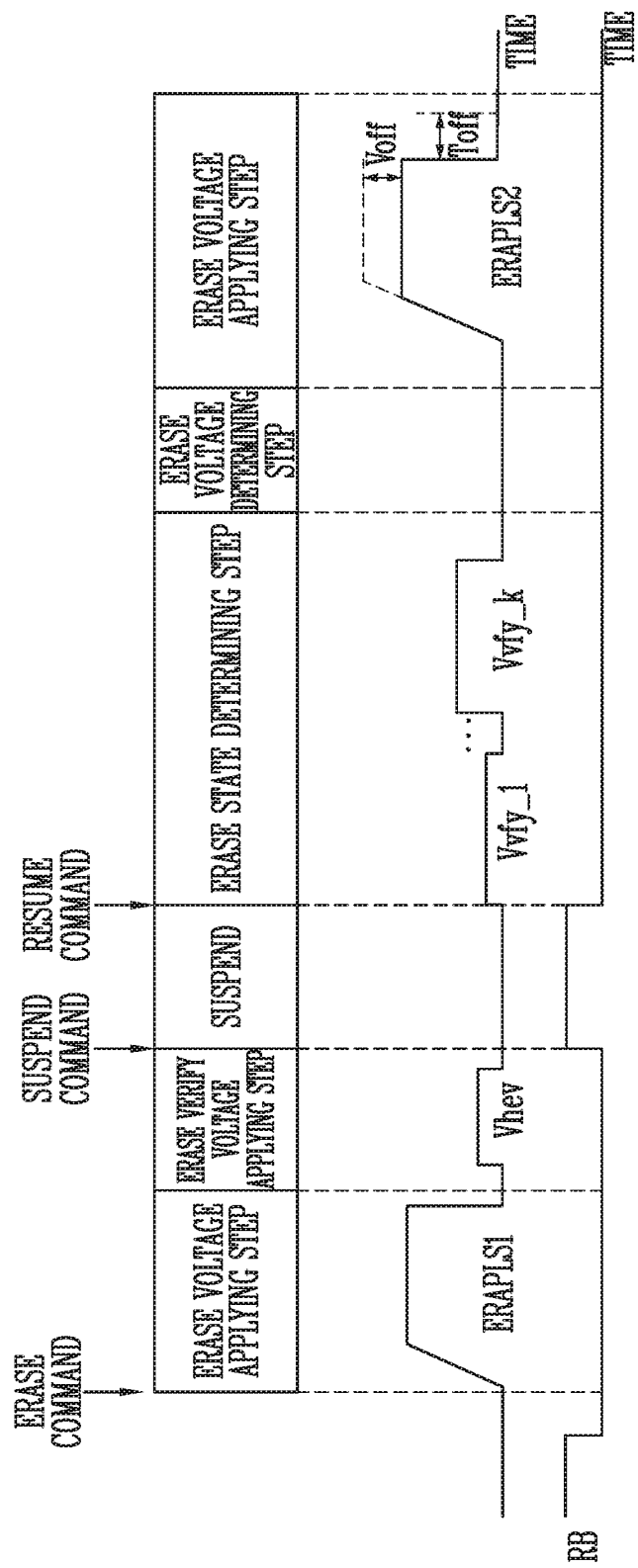
FIG. 10 is a waveform diagram illustrating an erase state determination step and an erase voltage determination step in accordance with an embodiment of the present disclosure.

FIG. 10 is a waveform diagram illustrating an erase state determination step and an erase voltage determination step in accordance with an embodiment of the present disclosure.

Referring to FIG. 10, an upper waveform represents a voltage pulse applied to the memory device in an erase operation, and a lower waveform represents a signal indicating a ready/busy state RB (i.e., a ready/busy signal RB) of the memory device when a suspend command and a resume command are input.

When an erase command is input from the memory controller, the memory device may apply a first erase voltage ERAPLS1 to a channel region of memory cell strings in a memory block to be erased. Subsequently, the memory device may apply an erase verify voltage Vhev to word lines coupled to the memory block so as to determine whether memory cells in the memory block to be erased have threshold voltages corresponding to the erase state. The memory cells may be determined as on-cells or off-cells according to whether the threshold voltages of the memory cells are less than the erase verify voltage Vhev.

When the suspend command is input, the memory controller may suspend the erase operation being performed. That is, the memory controller may suspend the erase operation such that the memory device can perform one or more other operations of higher priority than the erase operation. Accordingly, the ready/busy signal RB becomes high.

After the higher priority operations are performed, the suspended erase operation may be re-performed. Therefore, the memory controller may provide the resume command with respect to the memory block that was being erased before the suspend command was received. Accordingly, the ready/busy signal RB becomes low.

When the resume command is input, the memory device may perform an erase state determination step and an erase voltage determination step. In the erase state determination step, a plurality of erase state verify voltages may be applied to the word lines coupled to the memory block to be erased. Memory cells having threshold voltages less than a first erase state verify voltage Vvfy_1 may be determined as on-cells, and memory cells having threshold voltages greater than or equal to the first erase state verify voltage Vvfy_1 may be determined as off-cells. When the number of memory cells determined as on-cells is less than a set value, the memory device may apply a second erase state verify voltage obtained by increasing the magnitude of an erase state verify voltage by a set voltage. As described above, the memory device may repeat an operation of applying the erase state verify voltage, increasing the erase state verify voltage of the last operation by a set step voltage.

In FIG. 10, when the number of memory cells having threshold voltages lower than a kth erase state verify voltage is greater than or equal to a set value, the memory device may end the erase state determination step after the kth erase state verify voltage is applied, and perform the erase voltage determination step.

In the erase voltage determination step, the memory device may determine an erase voltage magnitude offset Voff as a magnitude of a voltage which represents the difference of a second erase voltage to be applied compared with the first erase voltage ERAPLS1 and also determine an erase voltage apply time offset Toff as an apply time which represents the time of applying the second erase voltage compared with the time for which the first erase voltage ERAPLS1 is applied, according to the number of times the erase state verify voltage is applied in the erase state determination step. Further, the memory device may apply a second erase voltage ERAPLS2, determined according to the erase voltage magnitude offset Voff and the erase voltage apply time offset Toff, to the channel region of the memory cell strings of the memory block to be erased. Each of the erase voltage magnitude offset Voff and the erase voltage apply time offset Toff may have a positive or negative value.

This may mean that, as the number of times k the applied erase state verify voltage is applied becomes smaller, a threshold voltage distribution of the memory cells in the memory block to be erased is further moved to the left than when the number k of times the applied erase state verify voltage is applied is relatively large. That is, the threshold voltage distribution of the memory cells in the memory block to be erased may be closer to that of the erase state. Therefore, an erase voltage magnitude offset Voff and an erase voltage apply time offset Toff may both be less when the number of times k the erase state verify voltage is applied is relatively small than when the number of times k the erase state verify voltage is applied is relatively large.

On the contrary, this means that, as the number of times k the erase state verify voltage is applied becomes larger, the threshold voltage distribution of the memory cells in the memory block to be erased is further moved to the right compared to when the number of times k the applied erase state verify voltage is applied is relatively small. Therefore, an erase voltage magnitude offset Voff and an erase voltage apply time offset Toff when the number of times k the erase state verify voltage is applied is relatively large may be greater than when the number k of times the erase state verify voltage is applied is relatively small.

Figure 11:
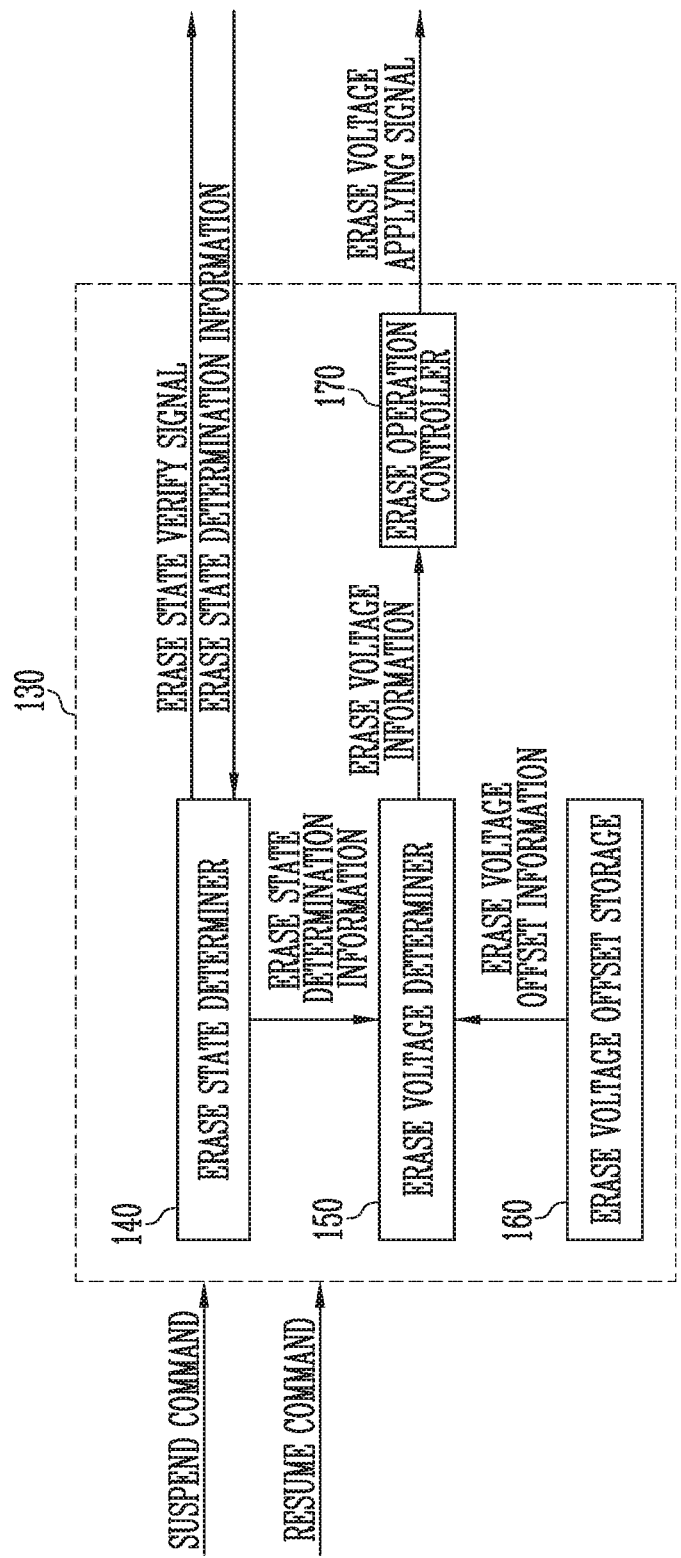
FIG. 11 is a device diagram illustrating in detail a structure of a memory device, such as that shown in FIG. 1.

FIG. 11 is a device diagram illustrating in detail a structure of the control logic 130 shown in FIG. 2.

Referring to FIG. 11, the control logic 130 may include an erase state determiner 140, an erase voltage determiner 150, an erase voltage offset storage 160, and an erase operation controller 170.

The erase state determiner 140 may determine an erase state of memory cells. The erase state determiner 140 may provide an erase state verify signal to the peripheral circuit 120 of FIG. 2. The memory device 100 may perform an erase state determination operation in response to the erase state verify signal. The erase state determination operation may be an operation of determine whether threshold voltages of memory cells in a memory block to be erased correspond to a threshold voltage of the erase state by applying a plurality of erase state verify voltages. The plurality of erase state verify voltages may be voltages sequentially increased by a predetermined verify step voltage. The erase state determiner 140 may generate erase state determination information, based on the number of on-cells or off-cells sensed by the plurality of erase state verify voltages. For example, the erase state determination information may include information on the number of times the erase state verify voltage is applied until the number of on-cells exceeds a set reference number or the number of times the erase state verify voltage is applied until the number of off-cells is less than the set reference number.

The erase voltage determiner 150 may generate erase voltage information, based on the erase state determination information and erase voltage offset information stored in the erase voltage offset storage 160.

The erase voltage information may include information on the magnitude of an erase voltage and a time for which the erase voltage is applied.

The erase voltage offset storage 160 may store the erase voltage offset information. The erase voltage offset information may be information obtained by storing, in the form of a lookup table, an offset according to the number of times the erase state verify voltage is applied. The offset may include a magnitude offset representing an increase or decrease of the erase voltage, based on an initial or immediately previous voltage of the erase voltage, and an apply time offset representing an increase or decrease of the time for which the erase voltage is applied, based on a time for which the erase voltage is applied in an initial or immediately previous loop.

The erase voltage determiner 150 may generate the erase voltage information with reference to the erase voltage offset information, based on the number of times the erase state verify voltage in the erase state determination information is applied. The erase voltage information may include an erase voltage magnitude offset and an erase voltage apply time offset, which are determined according to the number of times the erase state verify voltage is applied.

The erase operation controller 170 may provide an erase voltage applying signal to the peripheral circuit 120 so as to apply an erase voltage determined according to the erase voltage information.

FIG. 12 is a diagram illustrating an erase voltage offset storage 160 in accordance with an embodiment of the present disclosure.

Referring to FIG. 12, the erase voltage offset storage 160 may store erase voltage offset information according to the number of times the erase state verify voltage is applied.

In an embodiment, the erase voltage offset information may include an erase voltage magnitude offset Voff and/or an erase voltage apply time offset Toff. The erase voltage magnitude offset Voff corresponds to the magnitude of an erase voltage increased or decreased based on the magnitude of an initial or immediately previous erase voltage. The erase voltage apply time offset Toff corresponds to an apply time increased or decreased based on the time for which the initial or immediately previous erase voltage is applied. Alternatively, in various embodiments, when information on an erase voltage applied lastly is stored, the erase voltage offset information may be information on an offset determined based on the erase voltage applied lastly before an erase operation is suspended according to a suspend command.

In FIG. 12, when the number of times the erase state verify voltage Vvfy is applied is 1, the erase voltage magnitude offset Voff may have a first erase voltage magnitude offset Voff_1. The erase voltage apply time offset Toff may have a first erase voltage apply time offset Toff_1.

When the number of times the erase state verify voltage Vvfy is applied is 2, the erase voltage magnitude offset Voff may have a second erase voltage magnitude offset Voff_2. The erase voltage apply time offset Toff may have a second erase voltage apply time offset Toff_2.

When the number of times the erase state verify voltage Vvfy is applied is 3, the erase voltage magnitude offset Voff may have a third erase voltage magnitude offset Voff_3. The erase voltage apply time offset Toff may have a third erase voltage apply time offset Toff_3.

In this manner, when the number of times the erase state verify voltage Vvfy is applied is k, the erase voltage magnitude offset Voff may have a kth erase voltage magnitude offset Voff_k. The erase voltage apply time offset Toff may have a kth erase voltage apply time offset Toff_k.

In an embodiment, as the number of times the erase state verify voltage Vvfy is applied increases, the erase voltage magnitude offset Voff may increase, and the erase voltage apply time offset Toff may decrease. In various embodiments, as the number of times the erase state verify voltage Vvfy is applied increases, both the erase voltage magnitude offset Voff and the erase voltage apply time offset Toff may increase. Alternatively, in an embodiment, as the number of times the erase state verify voltage Vvfy is applied increases, the erase voltage magnitude offset Voff may be maintained as a constant value, and the erase voltage apply time offset Toff may increase.

Figure 13:
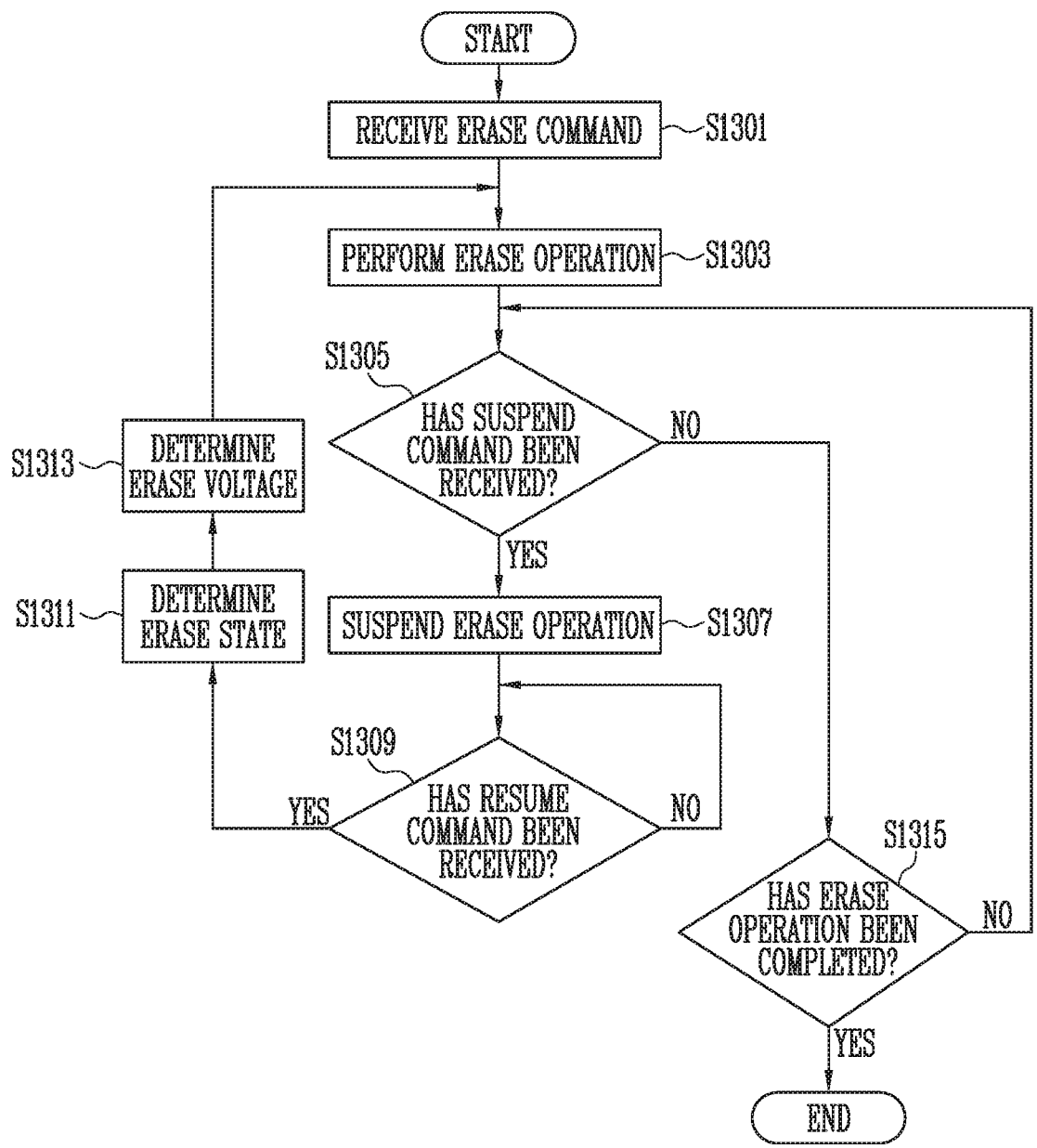
FIG. 13 is a flowchart illustrating an operating method of the memory device in accordance with an embodiment of the present disclosure.

FIG. 13 is a flowchart illustrating an operating method of the memory device in accordance with an embodiment of the present disclosure.

Referring to FIG. 13, in step S1301, the memory device may receive an erase command from the memory controller. The erase command may instruct the memory device to perform an erase operation on a memory block to be erased.

In step S1303, the memory device may perform an erase operation in response to the input erase command. The erase operation may include a plurality of erase loops. One erase loop may include an erase voltage applying step and an erase verifying step. The memory device may perform a plurality of erase loops until an erase verify operation passes.

In step S1305, the memory device may determine whether a suspend command is input from the memory controller. When it is determined that the suspend command is input (S1305, YES), the method proceeds to step 1307. When it is determined that the suspend command is not input (S1305, NO), the method proceeds to step S1315.

In the step S1307, the memory device may suspend the erase operation being performed in response to the suspend command. Subsequently, one or more other operations of higher priority than the erase operation may be performed until a resume command is input.

In step S1309, the memory device may determine whether step S1311 is to be performed according to whether the resume command is received. When it is determined that the resume command is received (S1309, YES), the memory device may perform the step S1311. When it is determined that the resume command is not received (S1309, NO), the memory device may maintain the suspended state of the erase operation in the step S1307 until the resume command is input, and wait until the resume command is input.

In the step S1311, when it is determined that the resume command is input from the memory controller, the memory device may determine an erase state. For example, the memory device may include a plurality of erase state verify operations. The memory device may perform erase state verify operations until the number of on-cells sensed according to an erase state verify voltage exceeds a set reference number. Alternatively, the memory device may perform erase state verify operations until the number of off-cells sensed according to the erase state verify voltage is less than the set reference number.

In step S1313, the memory device may determine an erase voltage to be applied based on the number of times the erased state verify voltage applied in the step S1311 is applied. Specifically, the erase voltage may be determined according to an erase voltage magnitude offset Voff and an erase voltage apply time offset Toff, which correspond to the number of times the erase state verify voltage is applied.

The step S1315 may be performed when it is determined that the suspend command is not input in the step S1305. The memory device may determine whether a threshold voltage of each of a plurality of memory cells in the memory block to be erased corresponds to that of the erase state, by applying an erase verify voltage to word lines of the plurality of memory cells. The erase operation may end when the number of memory cells each having a threshold voltage corresponding to that of the erase state is greater than or equal to a set number.

Figure 14:
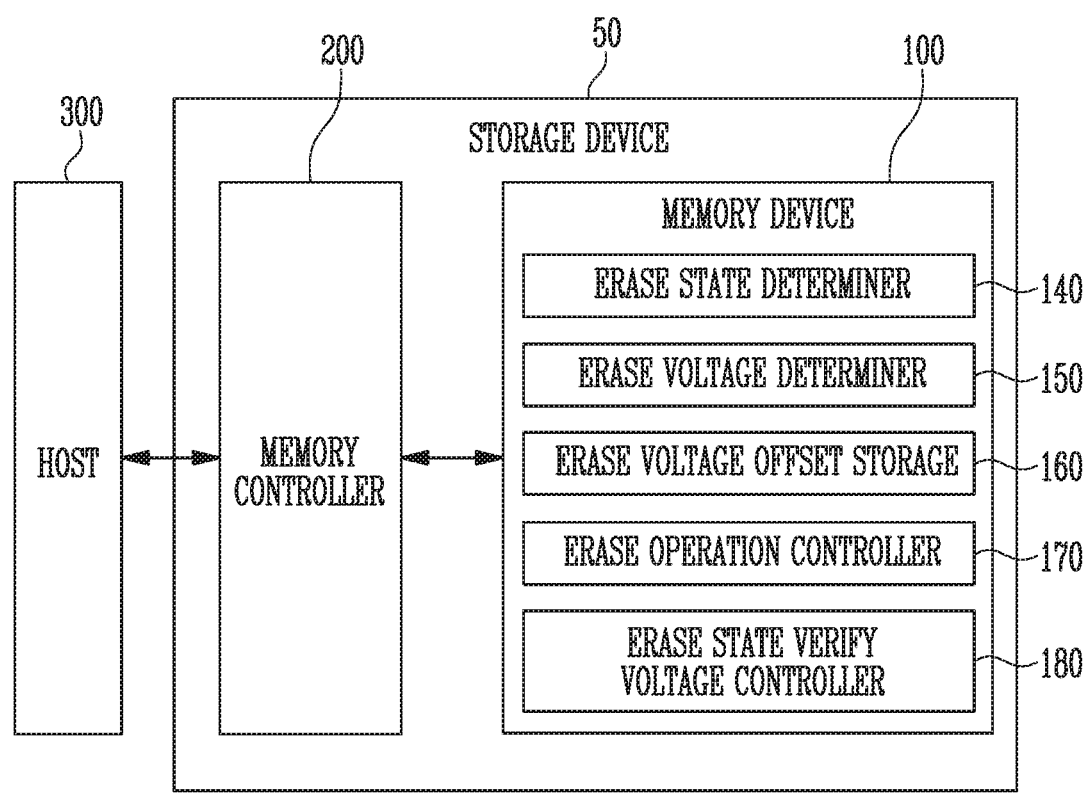
FIG. 14 is a diagram illustrating a structure of a storage device in accordance with another embodiment of the present disclosure.

FIG. 14 is a diagram illustrating a structure of a storage device 50 in accordance with another embodiment of the present disclosure.

Referring to FIG. 14, the storage device 50 may include a memory device 100 and a memory controller 200. The memory device 100 may additionally include an erase state verify voltage controller 180 in the memory device 100 described with reference to FIG. 1.

The memory device 100 may have a structure to the same or substantially the same as that of the memory device 100 described with reference to FIG. 2, except for the addition of the erase state verify voltage controller 180.

The memory device 100 may include the erase state determiner 140, the erase voltage determiner 150, the erase voltage offset storage 160, the erase operation controller 170, and the erase state verify voltage controller 180.

The erase state verify voltage controller 180 may determine a plurality of erase state verify voltages to be applied according to a resume command. Specifically, the erase state verify voltage controller 180 may determine a start voltage of an erase state verify voltage, a magnitude of a verify step voltage, and a maximum number of times an erase state is verified, based on a suspend time.

Operations of the erase state determiner 140, the erase voltage determiner 150, the erase voltage offset storage 160, and the erase operation controller 170 may be the same as those described with reference to FIG. 11.

Figure 15:
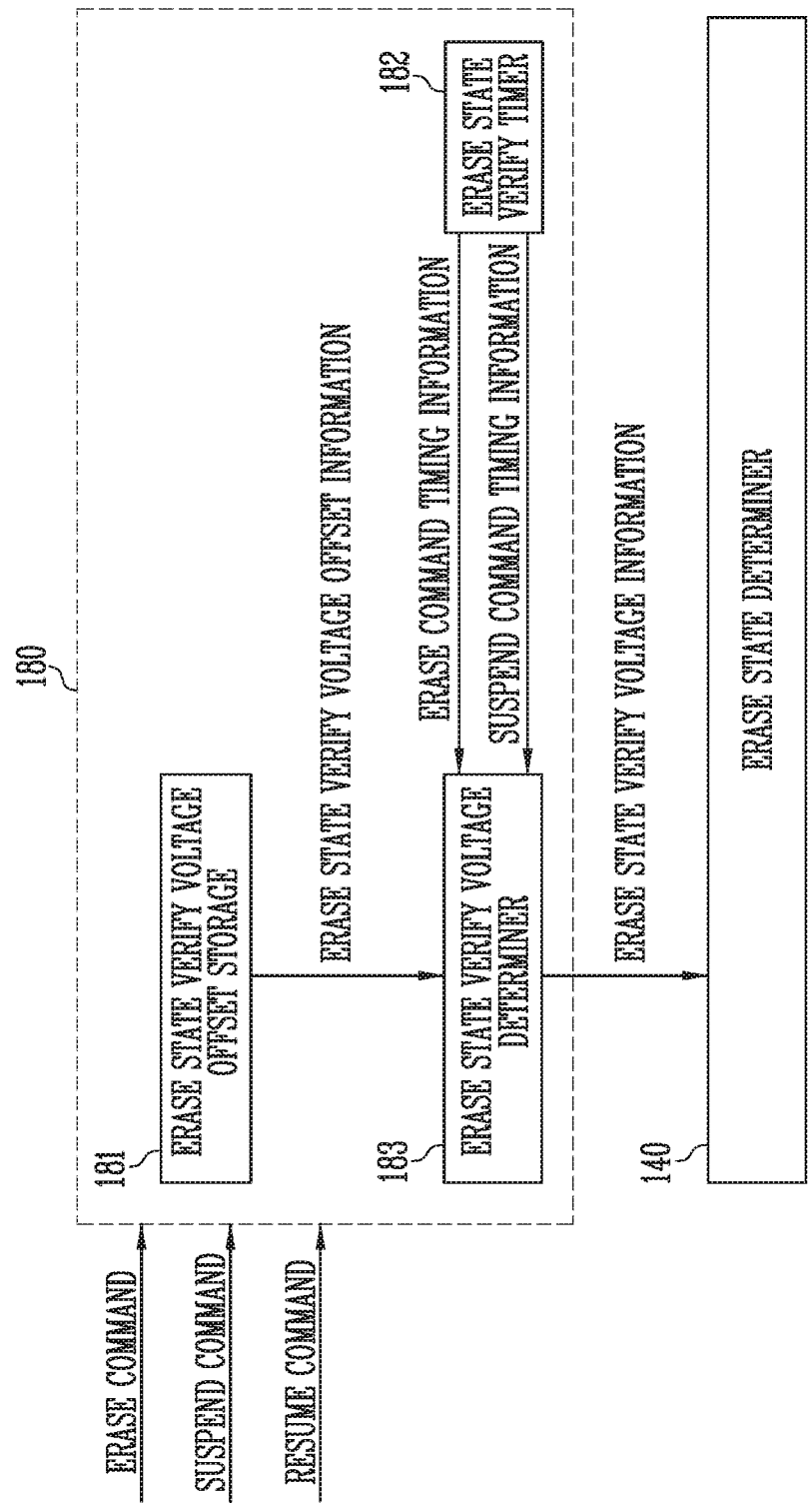
FIG. 15 is a device diagram illustrating in detail a structure of an erase state verify voltage controller, such as that shown in FIG. 14.

FIG. 15 is a device diagram illustrating in detail a structure of the erase state verify voltage controller 180 shown in FIG. 14.

Referring to FIG. 15, the erase state verify voltage controller 180 may include an erase state verify voltage offset storage 181, an erase state verify timer 182, and an erase state verify voltage determiner 183.

The erase state verify voltage offset storage 181 may store an erase state verify voltage offset information according to an erase progress time. The erase progress time may represent a difference (te−ts) between a time te at which an erase command is input from the memory controller and a time ts at which a suspend command is input from the memory controller. The erase state verify voltage offset information may be information that represents, in the form of a lookup table, information on a start voltage of an erase state verify voltage, a maximum number of times an erase state is verified, and a verify step voltage.

The erase state verify timer 182 may store erase command timing information as information on a time te at which an erase command is input when the erase command is input from the memory controller. Further, the erase state verify timer 182 may store suspend command timing information as information on a time ts at which a suspend command is input when the suspend command is input from the memory controller.

The erase state verify voltage determiner 183 may acquire the erase command timing information and the suspend command timing information from the erase state verify timer 182. Further, the erase state verify voltage determiner 183 may calculate an erase progress time as a difference (te−ts) between a time te at which an erase command stored in the erase state verify voltage offset storage 180 is input and a time ts at which a suspend command stored in the erase state verify voltage offset storage 180 is input. The erase state verify voltage determiner 183 may generate erase state verify voltage information, based on the erase progress time and the erase state verify voltage offset information. The generated erase state verify voltage information may be provided to an erase state determiner 140. The erase state determiner 140 may be operated and configured the same or substantially the same as the erase state determiner 140 described with reference to FIG. 11.

This may mean that a larger number of erase loops are performed as the erase progress time, as the difference (te−ts) between the time to at which the erase command is input and the time ts at which the suspend command is input, increases. Therefore, a threshold voltage distribution of memory cells may be more adjacent to the erase state as the erase progress time increases. Accordingly, the erase state verify voltage determiner 183 may determine an erase state verify voltage such that, as the erase progress time increases, the start voltage of the erase state verify voltage used in the erase state determination step and the magnitude of the erase state step voltage decrease, and the maximum number of times an erase state is verified increases.

On the contrary, this may mean that a smaller number of erase loops were previously performed as the erase progress time decreases. Therefore, a threshold voltage distribution of memory cells may be more distant from the erase state as the erase progress time decreases. Accordingly, the erase state verify voltage determiner 183 may determine an erase state verify voltage such that, as the erase progress time decreases, the start voltage of the erase state verify voltage used in the erase state determination step and the magnitude of the erase state step voltage increases, and the maximum number of times an erase state is verified decreases.

FIG. 16 is a diagram illustrating an erase state verify voltage offset storage, e.g., the erase state verify voltage offset storage 160 of FIG. 14, in accordance with an embodiment of the present disclosure.

Referring to FIG. 16, the erase state verify voltage offset storage may store erase state verify voltage offset information according to an erase progress time. The erase progress time may correspond to a difference (te−ts) between a time te at which the erase command is input and a time ts at which the suspend command is input. The erase state verify voltage offset information may include an erase state verify start voltage, a maximum number of times an erase state is verified, and an erase state verify step voltage. Each of the time te and the time ts may have a positive value.

In FIG. 16, when the difference (te−ts) is T_1, the erase state verify start voltage in the erase state verify voltage offset information may have a first erase state verify start voltage X_1, the maximum number of times the erase state is verified in the erase state verify voltage offset information may have a first maximum number Y_1 of times the erase state is verified, and the erase state verify step voltage in the erase state verify voltage offset information may have a first erase state verify step voltage Z_1.

When the difference (te−ts) is T_2, the erase state verify start voltage in the erase state verify voltage offset information may have a second erase state verify start voltage X_2, the maximum number of times the erase state is verified in the erase state verify voltage offset information may have a second maximum number Y_2 of times the erase state is verified, and the erase state verify step voltage in the erase state verify voltage offset information may have a second erase state verify step voltage Z_2.

When the difference (te−ts) is T_3, the erase state verify start voltage in the erase state verify voltage offset information may have a third erase state verify start voltage X_3, the maximum number of times the erase state is verified in the erase state verify voltage offset information may have a third maximum number Y_3 of times the erase state is verified, and the erase state verify step voltage in the erase state verify voltage offset information may have a third erase state verify step voltage Z_3.

In this manner, when the difference (te−ts) is T_k, the erase state verify start voltage in the erase state verify voltage offset information may have a kth erase state verify start voltage X_k, the maximum number of times the erase state is verified in the erase state verify voltage offset information may have a kth maximum number Y_k of times the erase state is verified, and the erase state verify step voltage in the erase state verify voltage offset information may have a kth erase state verify step voltage Z_k.

In an embodiment, as the difference (te−ts) between the time to and the time is increases, each of the erase state verify start voltage and the erase state verify step voltage may decrease, and the maximum number of times the erase state is verified may increase.

Figure 17:
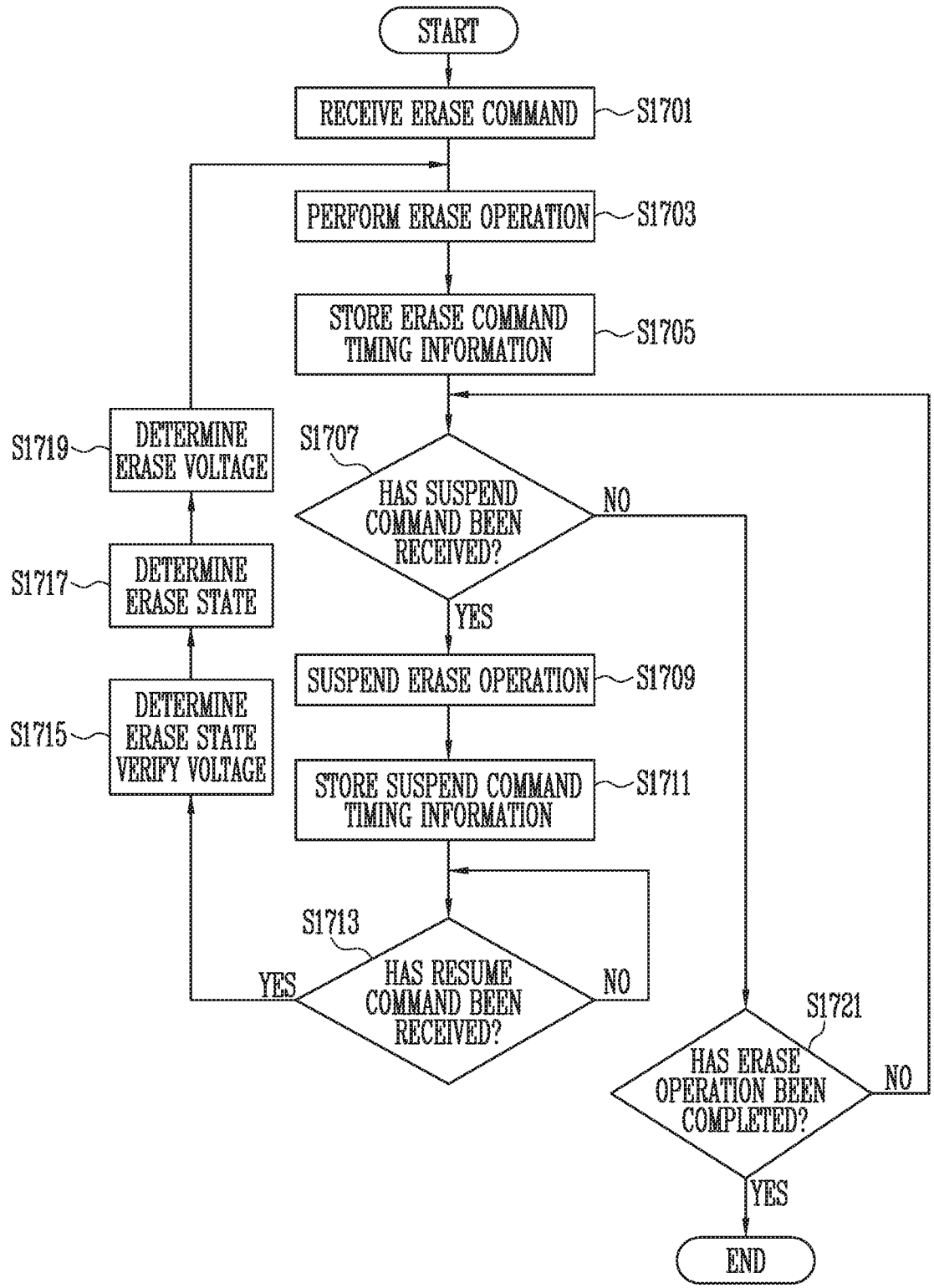
FIG. 17 is a flowchart illustrating an operation of a memory device in accordance with an embodiment of the present disclosure.

FIG. 17 is a flowchart illustrating an operation of a memory device in accordance with an embodiment of the present disclosure.

Referring to FIG. 17, when an erase command is input with respect to a memory block to be erased, the memory device may perform an erase operation such that memory cells in the memory block to be erased have threshold voltages corresponding to an erase state. Subsequently, when a suspend command is input, the erase operation may be suspended such that one or more other operations to be performed of higher priority than the erase operation can be performed until a resume command is input. When the resume command is input, the suspended erase operation may be re-performed. Before the suspended erase operation is resumed, an erase state determination step may be first performed. The erase state determination step may include determining whether the threshold voltages of the memory cells in the memory block to be erased correspond to a threshold voltage distribution of the erase state. Accordingly, a step of determining an erase voltage to be applied when the suspended erase operation is resumed nr ay be performed.

The steps, except steps S1705, S1711, and 1715, may be performed the same or substantially the same as the steps S1301 to S1315 described with reference to FIG. 13.

In the step S1705, the memory device may store a time te at which the erase command is input from the memory controller. The time te at which the erase command is input may have a positive value.

In the step S1711, the memory device may store a time ts at which the suspend command is input from the memory controller. The time ts at which the suspend command is input may have a positive value.

In the step S1715, the memory device may determine an erase state verify voltage according to the difference (te−ts) between the time te at which the erase command is input and the time ts at which the suspend command is input. This may mean that an erase loop has been performed more times as the difference (te−ts) increases. The erase loop may include a step of applying an erase voltage to a channel region of memory cell strings coupled to the memory block to be erased and an erase verify voltage apply step. The erase verify voltage apply step may include determining whether the threshold voltages of the memory cells included in the memory block to be erased correspond to the threshold voltage distribution of the erase state. When the erase loop is performed several times, a threshold voltage distribution of the memory cells in the memory block to be erased may approach the threshold voltage distribution of the erase state. Therefore, as the difference (te−ts) increases, the start voltage and the step voltage of the erase state verify voltage, which are used in the erase state determination step performed when the resume command is input, may decrease, and the maximum number of times the erase state is verified may increase.

In accordance with the embodiment shown in FIG. 17, the erase state verify voltage may be differently set until the erase operation being performed is suspended in response to the suspend command. Specifically, the erase state verify start voltage, the erase state verify step voltage, and the maximum number of times the erase state is verified may be differently set. In general, a threshold voltage distribution may come closer to that of the erase state as the number of times the erase loop is performed increases. As compared with the embodiment shown in FIG. 13, in the embodiment shown in FIG. 17, the erase state verify start voltage, the erase state verify step voltage, and the maximum number of times the erase state is verified are differently set depending on the number of times the erase loop has already been performed. Thus, an erase state verify voltage applied unnecessarily may be reduced, and a threshold voltage distribution of memory cells may be improved.

Figure 18:
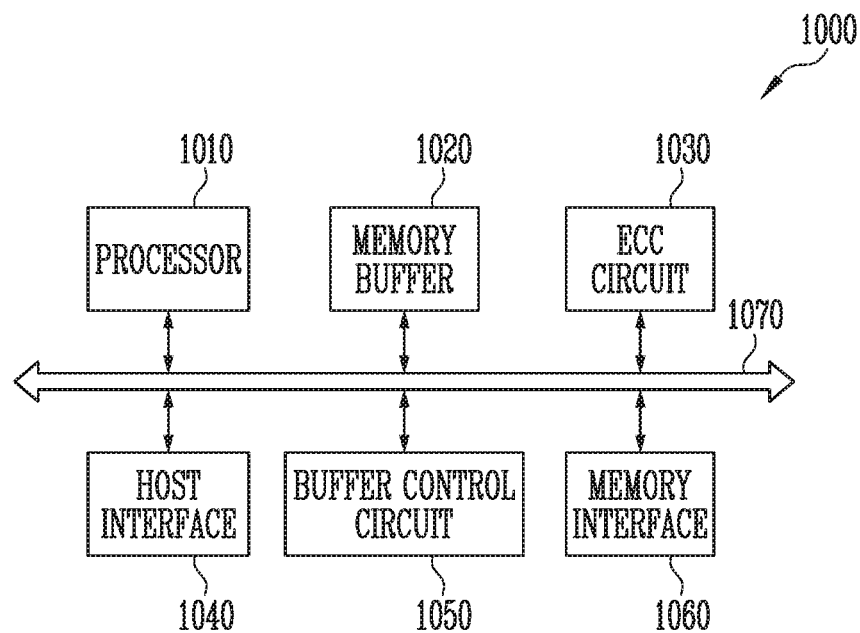
FIG. 18 is a diagram illustrating another embodiment of a memory controller, such as that shown in FIG. 1.

FIG. 18 is a diagram illustrating another embodiment of the memory controller shown in FIG. 1.

Referring to FIG. 18, a memory controller 1000 is coupled to a host and a memory device. The memory controller 1000 may access the memory device in response to a request received from the host. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical address (LA) provided by the host through the FTL into a physical address (PA). The FTL may receive an LA, using a mapping table, to translate the LA into a PA. Several address mapping methods of the FTL exist according to mapping units. A representative address mapping method includes a page mapping method, a block mapping method, and a hybrid mapping method.

The processor 1010 may randomize data received from the host. For example, the processor 1010 may randomize data received from the host, using a randomizing seed. The randomized data is provided as data to be stored to the memory device to be programmed in the memory cell array.

In a read operation, the processor 1010 may derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a static RAM (SRAM) or a dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated so as not to interfere with, or influence, each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 19:
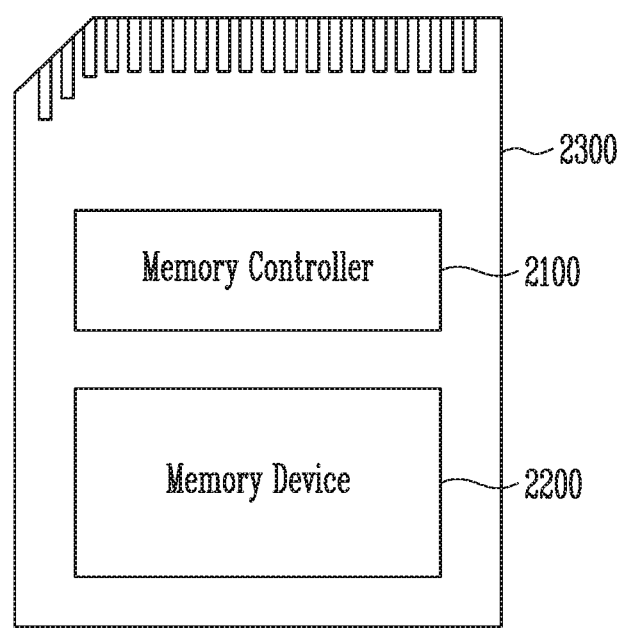
FIG. 19 is a block diagram illustrating a memory card system to which the storage device is applied in accordance with an embodiment of the present disclosure.

FIG. 19 is a block diagram illustrating a memory card system 2000 to which the storage device is applied in accordance with an embodiment of the present disclosure.

Referring to FIG. 19, the memory card system 2000 includes a memory controller 2100, a memory device, and a connector 2300.

The memory controller 2100 is coupled to the memory device 2200. The memory controller 2100 may access the memory device 2200. The memory controller 2100 may be implemented to the same or substantially the same as the memory controller 200 described with reference to FIG. 1.

In an example, the memory controller 2100 may include components such as a random access memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and/or NVMe.

In an example, the memory device 2200 may be implemented with any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), and/or a Spin Torque Transfer magnetic RAM (STT-MRAM).

The memory controller 2100 and the memory device 2200 may be integrated into a single semiconductor device to constitute a memory card, such as a PC card (Personal Computer Memory Card International Association (PCM-CIA)), a Compact Flash (CF) card, a Smart Media Card (e.g., SM and SMC), a memory stick, a Multi-Media Card (e.g., MMC, RS-MMC, MMCmicro and eMMC), a secure digital (SD) card (e.g., SD, miniSD, microSD and SDHC), and/or a Universal Flash Storage (UFS).

The memory controller 2100 shown in FIG. 21 may be the memory controller 200 described with reference to FIG. 1 or described with reference to FIG. 14. Also, the memory device 2200 may correspond to the memory device 100 described with reference to FIG. 1 or described with reference to FIG. 14.

Figure 20:
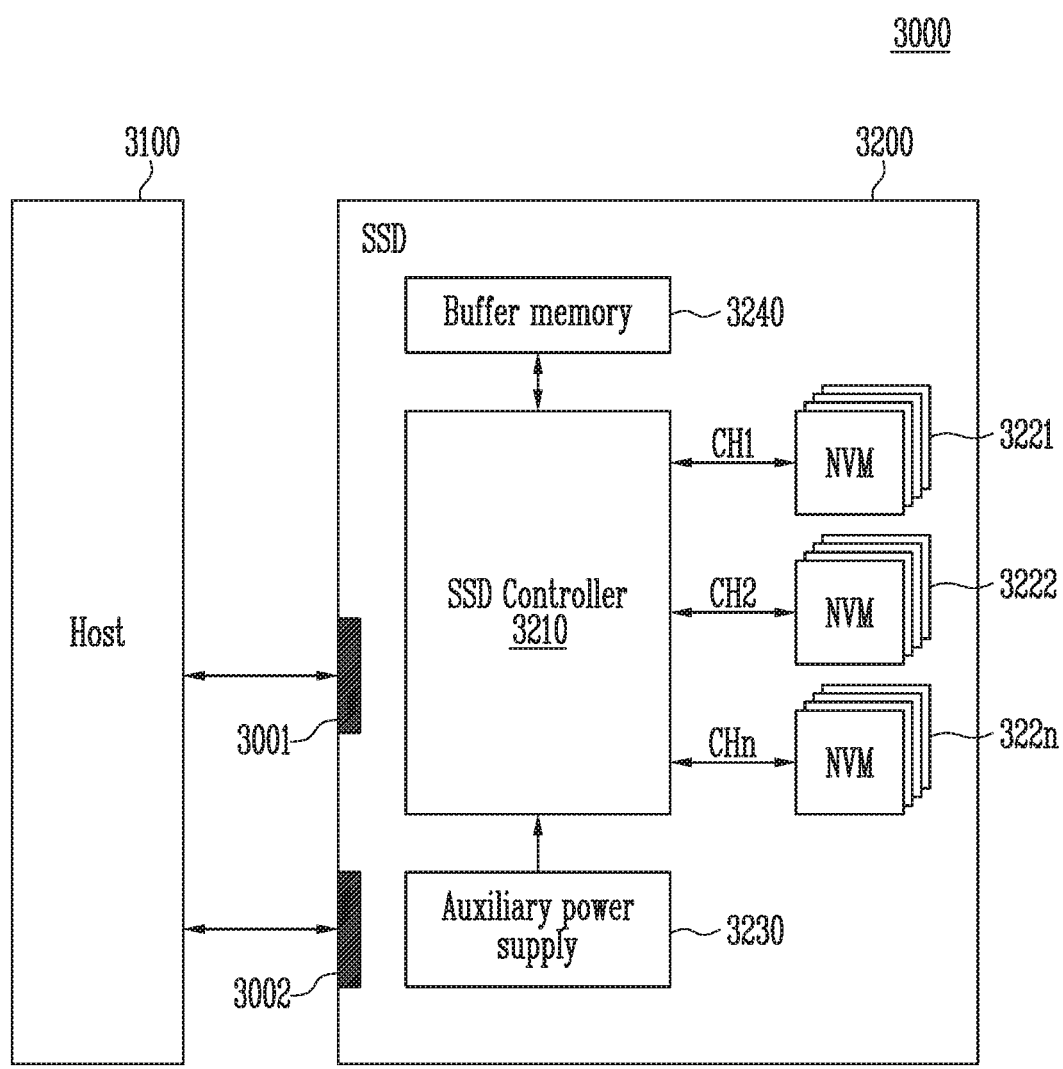
FIG. 20 is a block diagram exemplarily illustrating a solid state drive (SSD) system to which the storage device is applied in accordance with an embodiment of the present disclosure.

FIG. 20 is a block diagram exemplarily illustrating a solid state drive (SSD) system 3000 to which the storage device is applied in accordance with an embodiment of the present disclosure.

Referring to FIG. 20, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322$n$, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322$n$ in response to a signal SIG received from the host 3100. In an example, the signal SIG may be based on an interface between the host 3100 and the SSD 3200. For example, the signal SIG may be defined by at least one of various interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a wireless fidelity (Wi-Fi), a Bluetooth, and/or a nonvolatile memory express (NVMe).

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322$n$, or temporarily store meta data (e.g., a mapping table) of the flash memories 3221 to 322$n$. The buffer memory 3240 may include any of various volatile memories such as a DRAM, an SDRAM, a DDR SDRAM, an LPDDR SDRAM, and a GRAM or any of various nonvolatile memories such as a FRAM, a ReRAM, an STT-MRAM, and a PRAM.

FIG. 21 is a block diagram illustrating a user system 4000 to which the storage device is applied in accordance with an embodiment of the present disclosure.

Referring to FIG. 21, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include any of various volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or any of various nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory device having an improved threshold voltage distribution and an operating method of the memory device are provided.

While the present disclosure has been shown and described with reference to certain embodiments thereof, it will be understood by those skilled in the art that various changes in form and details may be made therein without departing from the spirit and scope of the present invention as defined by the appended claims and their equivalents. Therefore, the scope of the present disclosure should not be limited to the disclosed embodiments but should be determined by the appended claims and their equivalents.

In the above-described embodiments, certain steps may be selectively performed or parts thereof may be omitted. In each embodiment, the steps are not necessarily performed in accordance with the described order and may be rearranged. The embodiments disclosed herein are only examples to facilitate an understanding of the present invention, which is not limited thereto. That is, it should be apparent to those skilled in the art that various modifications can be made on the basis of the technological scope of the present disclosure.

Although specific terminologies are used, they are used only to explain embodiments of the present disclosure, not restrict any embodiment of the present invention. Rather, as those skilled in the art will understand various modifications can be made on the basis of the technological scope of the present disclosure in addition to the embodiments disclosed herein, and all such modifications are embraced by the present invention to the extent they fall within the scope of the claims.

What is claimed is:

1. A memory device comprising:
   a memory block including a plurality of memory cells;
   a peripheral circuit configured to perform an erase operation on the memory block; and
   control logic configured to: control the peripheral circuit to suspend the erase operation in response to a suspend command received from an external source, determine an erase state of the plurality of memory cells by using a plurality of erase state verify voltages in response to a resume command received subsequently to the suspend command, and determine a level of an erase voltage to be applied to the memory block and an erase voltage applying time for which the erase voltage is to be applied based on the determination result.

2. The memory device of claim 1, wherein the control logic includes:
   an erase state determiner configured to determine whether threshold voltages of the plurality of memory cells correspond to a threshold voltage distribution of the erase state by using the plurality of erase state verify voltages;
   an erase voltage offset storage configured to store erase voltage offset information representing an erase voltage offset according to a number of times the plurality of erase state verify voltages are applied; and
   an erase voltage determiner configured to output erase voltage information including the level of the erase voltage and the erase voltage applying time according to a number of times the erase voltage is applied, and the erase voltage offset information.

3. The memory device of claim 2, wherein the erase state determiner generates erase state determination information, based on a number of on-cells or off-cells, among the plurality of memory cells, sensed by the plurality of erase state verify voltages.

4. The memory device of claim 3, wherein the erase state determination information includes information on a number of times an erase state verify voltage is applied until the number of on-cells exceeds a set reference number.

5. The memory device of claim 3, wherein the erase state determination information includes information on a number of times an erase state verify voltage is applied until the number of off-cells is less than a set reference number.

6. The memory device of claim 2, wherein the erase voltage offset information includes an erase voltage magnitude offset representing an increase or decrease of the erase voltage, based on an initial voltage of the erase voltage, and an erase voltage apply time offset representing an increase or decrease of the erase voltage applying time, based on a time for which the erase voltage is applied in an initial loop of the erase operation.

7. The memory device of claim 6, wherein the erase voltage magnitude offset increases as the number of times the plurality of erase state verify voltages are applied increases.

8. The memory device of claim 6, wherein the erase voltage magnitude offset stays the same even when the number of times the plurality of erase state verify voltages are applied increases.

9. The memory device of claim 6, wherein the erase voltage apply time offset decreases as the number of times the plurality of erase state verify voltages are applied increases.

10. The memory device of claim 6, wherein the erase voltage apply time offset increases as the number of times the plurality of erase state verify voltages are applied increases.

11. The memory device of claim 2, further comprising an erase operation controller configured to control the peripheral circuit to generate the erase voltage according to the erase voltage information.

12. The memory device of claim 1, wherein the plurality of erase state verify voltages are higher than that of an erase verify voltage corresponding to the erase state.

13. A method for operating a memory device for performing an erase operation on a memory block including a plurality of memory cells, the method comprising:
performing the erase operation in response to an erase command received from a memory controller;
suspending the erase operation in response to a suspend command received from the memory controller;
determining a threshold voltage state of the plurality of memory cells by applying a plurality of erase state verify voltages to the plurality of memory cells, when a resume command is received from the memory controller; and
determining an erase voltage to be applied to the memory block, based on a result of the determining operation.

14. The method of claim 13, wherein the determining of the threshold voltage state of the plurality of memory cells comprises generating information on a number of times an erase state verify voltage is applied based on a number of on-cells or off-cells, among the plurality of memory cells, sensed by the plurality of erase state verify voltages.

15. The method of claim 14, wherein the determining of the erase voltage to be applied to the memory block comprises determining a level of the erase voltage based on the number of times the erase state verify voltage is applied and erase voltage offset information.

16. The method of claim 15, wherein the erase voltage offset information includes an erase voltage magnitude offset representing an increase or decrease of the erase voltage, based on an initial voltage of the erase voltage, and an erase voltage apply time offset representing an increase or decrease of the erase voltage applying time, based on a time for which the erase voltage is applied in an initial loop of the erase operation.

17. The method of claim 15, wherein the erase voltage magnitude offset increases as the number of times the plurality of erase state verify voltages are applied increases.

18. The method of claim 15, wherein the erase voltage magnitude offset stays the same even when the number of times the plurality of erase state verify voltages are applied increases.

19. The method of claim 15, wherein the erase voltage apply time offset decreases as the number of times the plurality of erase state verify voltages are applied increases.

20. The method of claim 15, wherein the erase voltage apply time offset increases as the number of times the plurality of erase state verify voltages are applied increases.

21. A storage device comprising:
a memory device including a plurality of memory cells;
a controller suitable for sequentially providing the memory device with an erase command, a suspend command and a resume command,
wherein the memory device:
performs an erase operation on the plurality of memory cells using a first erase voltage corresponding to a first erase pulse in response to the erase command;
suspends the erase operation in response to the suspend command;
verifies an erase state of the plurality of memory cells using a plurality of erase state verify voltages including a first erase state verify voltage and a second erase state verify voltage, greater than the first erase state verify voltage by a step voltage, in response to the resume command;
determines a level and a duration of a second erase pulse based on a result of the verify operation; and
re-performs the erase operation on the plurality of memory cells using a second erase voltage corresponding to the second erase pulse.

\* \* \* \* \*